US012651685B2

(12) United States Patent
Brouwer

(10) Patent No.: US 12,651,685 B2
(45) Date of Patent: Jun. 9, 2026

(54) STABILIZATION AND TUNING OF PERSISTENT CURRENTS USING VARIABLE INDUCTANCE

(71) Applicant: THE REGENTS OF THE UNIVERSITY OF CALIFORNIA, Oakland, CA (US)

(72) Inventor: Lucas Brouwer, Oakland, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 979 days.

(21) Appl. No.: 17/882,466

(22) Filed: Aug. 5, 2022

(65) Prior Publication Data

US 2023/0047878 A1     Feb. 16, 2023

Related U.S. Application Data

(60) Provisional application No. 63/236,728, filed on Aug. 25, 2021, provisional application No. 63/232,827, filed on Aug. 13, 2021.

(51) Int. Cl.
| | |
|---|---|
| *H01F 6/00* | (2006.01) |
| *G01R 33/3815* | (2006.01) |
| *G06N 10/00* | (2022.01) |
| *H01F 21/12* | (2006.01) |

(52) U.S. Cl.
CPC ......... *H01F 6/005* (2013.01); *G01R 33/3815* (2013.01); *G06N 10/00* (2019.01); *H01F 21/12* (2013.01)

(58) Field of Classification Search
CPC ...................................................... H01F 6/005
See application file for complete search history.

(56) References Cited

U.S. PATENT DOCUMENTS

| | | | | |
|---|---|---|---|---|
| 2,320,483 A | * | 6/1943 | Stocker | ................... H01F 21/06 |
| | | | | 334/70 |
| 4,266,732 A | * | 5/1981 | Sage | .................... A01G 25/092 |
| | | | | 336/134 |
| 4,987,390 A | * | 1/1991 | Mouri | ..................... H01F 36/00 |
| | | | | 331/187 |

(Continued)

OTHER PUBLICATIONS

Uchiyama, T. et al., "Low-Power Persistent switch for superconducting magnet", Review of Scientific Instruments 58, (11), Nov. 1987, pp. 2192-2193.

(Continued)

*Primary Examiner* — Paul A Wartalowicz
(74) *Attorney, Agent, or Firm* — O'BANION & RITCHEY LLP; John P. O'Banion

(57) ABSTRACT

An alternative approach to flux pumping in superconducting devices is described for fast and extremely precise tuning of the current during persistent mode operation. Rather than bringing in new flux from outside the circuit, the alternative approach stores a small flux in a tunable inductor (also referred to herein as a "flux bank") at the initial point of powering. Flux can be transferred back and forth from this bank to the main coil by simply changing the inductance of the bank. This allows for fine and fast adjustments of the persistent current without the use of thermal switches found in other approaches (which limit the adjustment speed and accuracy).

20 Claims, 33 Drawing Sheets

$$\frac{\phi_m}{\phi_0} = \frac{L_m}{L_m + L_b} \qquad \frac{\phi_b}{\phi_0} = \frac{L_b}{L_m + L_b}$$

(56) References Cited

U.S. PATENT DOCUMENTS

| | | | | |
|---|---|---|---|---|
| 5,022,275 | A * | 6/1991 | Satoh ..................... | G01L 1/125 |
| | | | | 73/779 |
| 5,701,043 | A * | 12/1997 | Razzaghi ............... | H10N 35/00 |
| | | | | 310/26 |
| 5,719,455 | A * | 2/1998 | Higasa .................. | F16C 37/005 |
| | | | | 310/90.5 |
| 2010/0044917 | A1 * | 2/2010 | Kruijt-Stegeman ... | B82Y 40/00 |
| | | | | 264/293 |
| 2014/0300355 | A1 * | 10/2014 | Fautz ................. | G01R 33/3664 |
| | | | | 324/309 |
| 2015/0187478 | A1 * | 7/2015 | Mallett ............... | G01R 33/093 |
| | | | | 505/211 |

OTHER PUBLICATIONS

Coombs, T.A., "Superconducting flux pumps", J. Appl. Phys., 125, 230902, Jun. 21, 2019, pp. 1-8.

Van De Klundert L.J.M. et al., "Fully superconducting rectifiers and fluxpumps Part 1: Realized methods for pumping flux", Cryogenics, Apr. 1981, pp. 195-206.

Iwasa, Yukilazu, "Microampere flux pumps for superconducting NMR magnets Part 1: basic concept and microtesla flux measurement", Cryogenics, 41, 2001, pp. 385-391.

Brittles, G. D. et al., "Persisent current joints between technological superconductors", Superconductor Science and Technology, 28, 2015, pp. 1-24.

Markiewicz, W. Denis, "Current Injection for Field Decay Compensation in NMR Spectrometer Magnets", IEEE Transactions on Applied Superconductivity, vol. 12, Dec. 2002, pp. 1886-1890.

Parizh, Michael et al., "Conductors for commercial MRI magnets beyond NbTi: requirements and challenges", Superconductor Science and Technology, 30, 2017, pp. 1-16.

Liu, Siyuan et al., "Superconducting Joint and Persistent Current Switch for a 7-T Animal MRI Magnet", IEEE Transactions on Applied Superconductivity, vol. 23, No. 3, Jun. 2013, pp. 1-4.

Parizh, Michael et al., "Current Reset in Superconducting Devices", MT26 International Conference on Magnet Technology, Thu-Mo-Po4.03.03, 2019, 1 page.

Brouwer, Lucas et al., "Stabilization and control of persistent current magnets using variable inductance", Superconductor Science and Technology, 35, Mar. 1, 2022, pp. 1-12.

Moser, Ewald et al., "Ultra-High Field NMR and MRI—The Role of Magnet Technology to Increase Sensitivity and Specificity", Frontiers in Physics, vol. 5, Article 33, Aug. 2017, pp. 1-15.

* cited by examiner $$\frac{\phi_m}{\phi_0} = \frac{L_m}{L_m + L_b}$$

$$\frac{\phi_b}{\phi_0} = \frac{L_b}{L_m + L_b}$$

$$\frac{\phi_m}{\phi_0} = \frac{L_m}{L_m + L_b - \Delta L} \qquad \frac{\phi_b}{\phi_0} = \frac{L_b - \Delta L}{L_m + L_b - \Delta L}$$

$$\frac{\phi_m}{\phi_0} = \frac{L_m}{L_m + L_b + \Delta L} \qquad \frac{\phi_b}{\phi_0} = \frac{L_b + \Delta L}{L_m + L_b + \Delta L}$$

700

800

900

1000

1100

1200

1500

1600

1602

1604

1606

1608

1610

1616

1612

1614

1800

1806

2600

2602

0.195 mm
gap change 0.382 G
field change 0.034 mm
gap change 0.085 G
field change

| Δg (micron) | ΔB (G) | ΔB/Δg (G/micron) | Δb/B (@100 G) |
|---|---|---|---|
| 195 | 0.382 | 0.00195958974 | 0.00382 |
| 34 | 0.085 | 0.0025 | 0.00085 |
| 16 | 0.04 | 0.0025 | 0.0004 |
| 0.6 | 0.0015 | 0.0025 | 0.000015 |
| 0.001 | 3E-06 | 0.0025 | 0.000000025 | estimated — 1.5 mG
estimated — 3 μg 15 ppm
25 ppb

3600

3620

STABILIZATION AND TUNING OF PERSISTENT CURRENTS USING VARIABLE INDUCTANCE

CROSS-REFERENCE TO RELATED APPLICATIONS

This application claims priority to, and the benefit of, U.S. provisional patent application Ser. No. 63/232,827 filed on Aug. 13, 2021 and incorporated herein by reference in its entirety. This application also claims priority to, and the benefit of, U.S. provisional patent application Ser. No. 63/236,728 filed on Aug. 25, 2021 and incorporated herein by reference in its entirety.

STATEMENT REGARDING FEDERALLY SPONSORED RESEARCH OR DEVELOPMENT

This invention was made with government support under Contract No. DE-AC02-05CH11231 awarded by the U.S. Department of Energy. The government has certain rights in the invention

NOTICE OF MATERIAL SUBJECT TO COPYRIGHT PROTECTION

BACKGROUND

1. Technical Field

The technology of this application pertains generally to superconducting devices, and more particularly to stabilization and tuning of persistent currents using variable inductance as an alternative to flux pumping.

2. Background Discussion

Flux pumping is a process by which an external flux is introduced to a closed superconducting circuit by means of inductive transfer. This process is desirable because it allows for adjusting the current of the circuit with minimal use of an external power supply or leads into the cryostat. A common use for flux pumping is to add a small amount of current to a magnet to offset dissipative loss from residual resistance in the superconducting joints completing the circuit or the superconductor itself. Flux pumps have been designed, tested, and appear to be in use for both MRI and NMR magnets operating in persistent modes.

It is well known that closed superconducting circuits conserve flux linkage. This, for example, is why the application and removal of an external flux does not, by itself, result in a net change of current. For this reason, flux pumping schemes for superconducting magnets are typically developed based on strategies that break and close superconducting connections to move flux into the desired closed loop within the circuit. A Recent overview of flux pumping techniques may be found in: T. Coombs. "Superconducting flux pumps" Journal of Applied Physics 125, 230902 (2019).

While there are many methods by which this "breaking" is performed, the most common involves quenching a segment of the superconducting circuit such that it becomes resistive. After the flux is adjusted by some external action, the quenched segment is allowed to recover and the closed superconducting circuit is restored.

The device which quenches and recovers is called a "persistent current switch" (PCS) and is typically a length of high resistivity matrix superconducting wire co-wound with a heater. The heater is turned on and off to break and then re-close the superconducting loop. This thermal based process is slow (typically on the order of several seconds) due to the competing needs to heat up and then re-cool the PCS back down quickly. This process can also deposit several watts of heating power into the cryostat. There also may be some limitations to the accuracy with which the persistent current can be set due to the switch recovery process providing a dynamic resistance.

BRIEF SUMMARY

In this application, an alternative approach to flux pumping is described as an option for fast and extremely precise tuning of the current during persistent mode operation of a superconducting circuit. Rather than bringing in new flux from outside the circuit, an alternative approach disclosed here stores a small quantity of flux in a tunable inductor (also referred to herein as a "flux bank") at the initial point of powering the circuit. Flux can be transferred back and forth from this bank to the main coil by simply changing the inductance of the bank. This application demonstrates that this alternative approach can be used to adjust the magnet coil current without breaking the superconducting circuit with a PCS. Eliminating the quench and recovery process of the PCS should allow for adjustment of the magnet current "on the fly" with very short adjustment times and the possibility for fast feedback. In addition, initial calculations show the level at which the current can be adjusted should be extremely precise, allowing for the $10^{-9}$-$10^{-10}$ relative adjustments, as required for a superconducting electron microscope. It is expected that the initial calculations in this application will allow for the design of a series of experiments to determine the ultimate usefulness of this approach. To this end, the conceptual design of a tuning bank is presented here for both an electron microscope lens and a 1.5-3.0 T MRI magnet based on tuning schemes incorporating existing cryogenic linear actuators.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

Many superconducting devices operate in persistent mode, which is characterized by the current powering the device flowing in a closed superconducting loop. Current initiated in such a loop "persists" without a power supply, giving the advantages of high stability operation (decoupled from power supply noise) and removal of the current leads into the cryostat, which are a large source of heat.

This application presents an approach for modifying the current in a closed superconducting loop by means of an adjustable superconducting inductor. In such an approach, the additional inductor acts as a flux storage device from which flux can be transferred back and forth to the main device by means of changing its inductance. This allows for fine and fast adjustments of the persistent current without the use of thermal switches found in other approaches that limit the adjustment speed and accuracy available. It is anticipated that this will enable tuning of persistent current devices "on the fly" as well as stabilization against dissipation from small resistances in superconducting joints and other superconducting loss mechanisms within the conductor.

The following discussion first presents the general concept and derives the relations seen as important for the design of a tuning system. Then, an example design is given for tuning and stabilization of a superconducting lens for an electron microscope. Finally, the design of a stabilization system for a typical MRI magnet is given as an alternative to flux pumping devices.

1. Flux Tuning with a Variable Inductor

In one embodiment, the presented technology stores a small amount extra of flux in an adjustable inductor at the time of initial powering (rather than bringing in new flux by breaking the superconducting circuit). This inductor acts as a "flux bank" from which flux is moved to and from the main coil by means of changing the inductance of the bank. This in turn allows for tuning of the current of the main coil. In fact, the simplicity of placing "extra" flux in the cryostat and then transferring it back and forth, leads to many different ways in which this concept can be implemented. In principle, any inductance change for an "extra" flux (in the sense that it has no utility for the main device) will do. For the sake of clarity, the simplest case of a tunable inductor in series will be examined.

Figure 1:
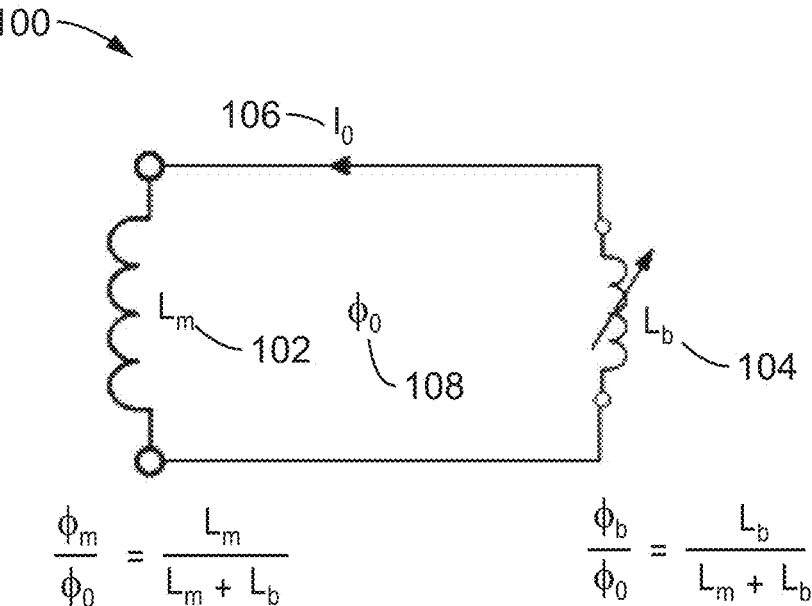
FIG. 1 is a simplified circuit comprised of a main inductor in series with a flux bank inductor operating with an initial current resulting in an initial total persistent flux.

Refer now to FIG. 1, which shows a simplified flux tuner circuit 100 comprised of a main inductor $L_m$ 102 in series with a flux bank inductor $L_b$ 104 operating with an initial current $I_0$ 106 resulting in a total flux of $\phi_0$ 108. Given that the main inductor $L_m$ 102 is in series with the flux bank inductor $L_b$ 104 coils, the flux is distributed between the main inductor $L_m$ 102 and flux bank inductor $L_b$ 104 as $$\phi_m = I_0 L_m$$

$$\phi_b = I_0 L_b, \tag{1, 2}$$

where $L_m$ and $L_b$ are the inductance of the main inductor $L_m$ 102 and flux bank inductor $L_b$ 104 respectively. The flux is clearly split between the two inductors based on the ratio of their inductances, with flux fractions given as:

$$\frac{\phi_m}{\phi_0} = \frac{L_m}{L_m + L_b} \tag{3, 4}$$

$$\frac{\phi_b}{\phi_0} = \frac{L_b}{L_m + L_b}.$$

A change in the inductance of the flux bank inductor $L_b$ 104 will cause the flux to re-balance.

Figure 2A:
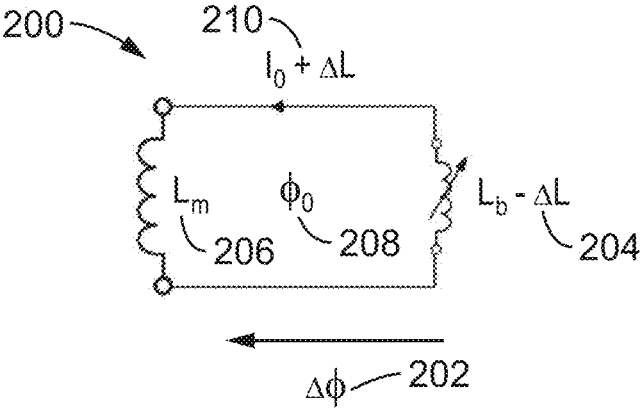
FIG. 2A is the simplified circuit of FIG. 1 demonstrating a shift of flux from the flux bank inductor to the main inductor.

Refer now to FIG. 2A, which is the simplified circuit of FIG. 1 demonstrating 200 a shift of flux 202 from the flux bank inductor 204 to the main inductor 206. The total flux $\phi_0$ 208 is conserved, meaning that a reduction in the flux bank inductor 204 ($L_b$−$\Delta L$) causes flux 202 to shift from the flux bank inductor 204 to the main inductor 206 with a net increase in current 210 of $I_0$+$\Delta I$.

Figure 2B:
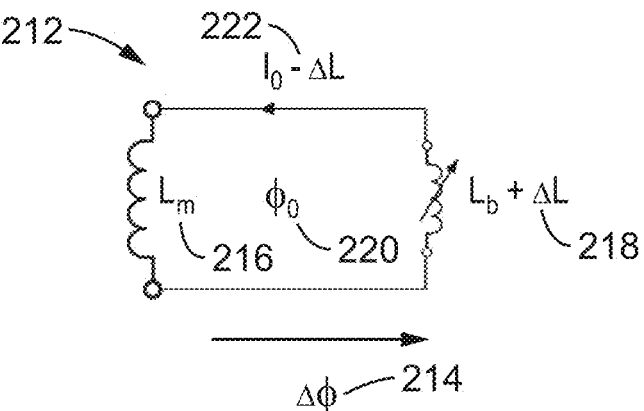
FIG. 2B is the simplified circuit of FIG. 1 demonstrating a shift of flux from the main inductor to the flux bank inductor.

Refer now to FIG. 2B, which is the simplified circuit of FIG. 1 demonstrating 212 a shift of flux 214 from the main inductor 216 to the flux bank inductor 218. The total flux $\phi_0$ 220 is conserved, meaning that a reduction in flux from the main inductor 216 to the flux bank inductor 218 ($L_b$+$\Delta L$)

causes flux 214 to shift from the main inductor 216 to the flux bank inductor 218 with a net decrease in current 222 of $I_0-\Delta I$.

The flux bank inductor 218 $L_b$ is increased to $L_b+\Delta L$, with the flux rebalancing by moving from the main inductor 216 to the flux bank inductor 218. The percentage of the flux moved from the flux bank inductor 218 to the main inductor 216 for a given change in the bank inductance of $\Delta L$ is $$\frac{\Delta\phi_{b\to m}}{\phi_0} = f_b\left(1 - \frac{1 + \frac{f_\Delta}{f_b}}{1 + f_\Delta}\right) \qquad (5)$$

where the inductance fractions are defined as $$f_b \equiv \frac{L_b}{L_m + L_b}. \qquad (6,7)$$

$$f_\Delta \equiv \frac{\Delta L}{L_m + L_b}.$$

This results in a relative change of flux in the main inductor 216 and the flux bank inductor 218 of $$\frac{\Delta\phi_m}{\phi_m} = -\frac{f_\Delta}{1 + f_\Delta} \qquad (8,9)$$

$$\frac{\Delta\phi_b}{\phi_b} = \left(\frac{1 - f_b}{f_b}\right)\frac{f_\Delta}{1 + f_\Delta},$$

and relative change in the current of $$\frac{\Delta I}{I_0} = -\frac{f_\Delta}{1 + f_\Delta}. \qquad (10)$$

With the initial flux $\phi_0$ 220 remaining constant, this process requires a change in energy since $$E = \frac{1}{2}LI^2 = \frac{1}{2}\phi_0 I, \qquad (11)$$

and the current has now changed. It is clear the relative change in energy is directly proportional to the relative current change such that $$\frac{\Delta E}{E_0} = -\frac{f_\Delta}{1 + f_\Delta}. \qquad (12)$$

For design of a system, it can be useful to rewrite some of these equations in terms of the initial ratio of the flux bank inductance 218 to main inductor 216 inductance (a design choice) and the local ratio of flux change in the flux bank inductance 218 (which is the active tuning mechanism). In this case, $f_\Delta$ can be re-written as $$f_\Delta = \frac{\Delta L}{L_m + L_b} = \left(\frac{1}{\frac{L_m}{L_b} + 1}\right)\frac{\Delta L}{L_b}. \qquad (13)$$

2. Flux Stabilization by Re-Balancing

One potential use of the flux bank approach is to stabilize the flux of the main device against unwanted changes. The most common issue is some small flux dissipation within the superconducting circuit which results in a net loss of total flux. Another example could be fast correction of fluxes which are injected or removed by the environment (i.e., unwanted outside electromagnetic coupling). Assume an unwanted relative change in total flux has occurred of magnitude $$\frac{\Delta\phi_{tot}}{\phi_{tot}}. \qquad (14)$$

If the inductance ratios remain constant during the unwanted change, the flux balance between the device and bank is maintained resulting in $$\frac{\Delta\phi_m}{\phi_m} = \frac{\Delta\phi_b}{\phi_b} = \frac{\Delta\phi_{tot}}{\phi_{tot}}. \qquad (15)$$

To return the device flux to its original value one simply has to adjust the inductance balance to shift flux to or from the device. Equation 8 can be used to find the inductance change that restores the initial condition in the device (but not the full system since some net flux has been gained or lost and is now conserved within the closed superconducting loop). From Equation 8, this gives $$\frac{(\Delta\phi_m)_{shift}}{\phi_{m'}} = -\frac{f_\Delta}{1 + f_\Delta}, \qquad (16)$$

where $\phi'_m$ is the new reference point of $\phi'_m=\phi_m+\Delta\phi_m$. In this case $$(\Delta\phi_m)_{shift} = -(\phi_m + \Delta\phi_m)\frac{f_\Delta}{1 + f_\Delta} = -\Delta\phi_m, \qquad (17)$$

making the required inductance change in the tuner of $$f_\Delta = \frac{\Delta L}{L_m + L_b} = \frac{\Delta\phi_m}{\phi_m}. \qquad (18)$$

3. Stabilization of Current Decay Due to Residual Resistance

There are two main sources of energy loss (resulting in current decay) in superconducting circuits. The first originates from the behavior of the superconductor itself, which exhibits a power law scaling between electric field and ratio of operating current to the critical current $$E = E_0\left(\frac{J}{J_c}\right)^n. \qquad (19)$$

The critical current $J_c$ is a function of field, meaning the majority of these losses occur in the highest field area of the magnet. In practice, these losses are minimized by selecting a conductor with high enough "n" value and/or operating the magnet at a current density J sufficiently far from the critical current $J_c$. Mitigation of this effect typically makes the key loss mechanism the slightly resistive joints closing the superconducting loops or connecting several superconducting devices together. Joints between superconductors is an active field of research (see G. Brittles, T. Mousavi, C. Grovenor, C. Aksoy, and S. Speller, "Persistent current joints between technological superconductors," Supercond. Sci. and Technol., vol. 28, p. 093001, 2015 for a topical review), with the joints achievable for Nb—Ti to Nb—Ti typically of the order of about $10^{-12}$-$10^{-14}\Omega$.

Figure 3:
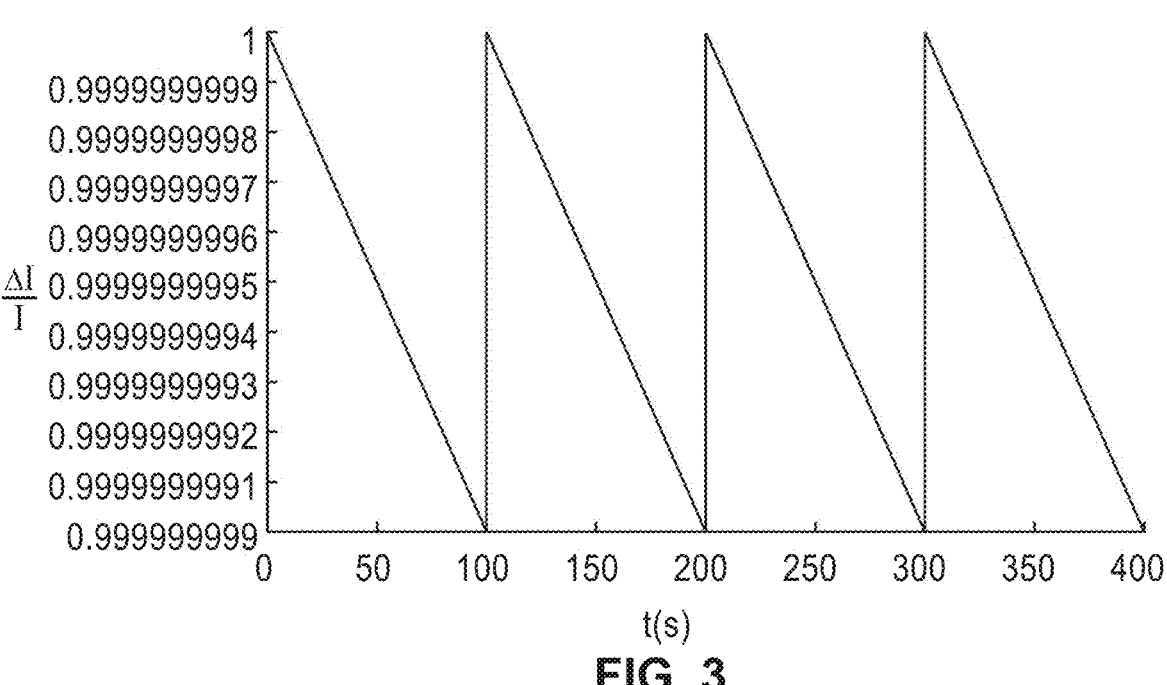
FIG. 3 is a plot of initial current $I_0$ decay versus time through four cycles of 100 second decay, where L=10 mH, R=$10^{-13}\Omega$, and $\Delta I/I_0=10^{-9}$.

Refer now to FIG. 3, which is a plot of initial current decay if joint resistance is the dominant loss mechanism. Here, an initial current/o in the closed loop of FIG. 1 superconducting circuit will decay with exponential behavior $$I(t) = I_0 e^{-\frac{t}{\tau}}, \tag{20}$$

where $$\tau = \frac{(L_m + L_b)}{R},$$

and R is the total residual resistance. This dissipates flux and removes it from the closed superconducting loop such that the total flux is decreasing over time as $$\phi_{tot}(t) = (L_m + L_b)I_0 e^{-\frac{t}{\tau}}, \tag{21}$$

In this particular FIG. 3 plot of initial current $I_0$ decay, L=10 mH, R=$10^{-13}\Omega$, and $$\frac{\Delta I}{I_0} = 10^{-9}.$$

Here, four consecutive ramps are shown of $I_0$ being reset to a unity value, and then decaying exponentially over a 100 second span, for a total plotted time span of 400 seconds.

Refer now to both FIG. 1 and FIG. 3. Assume that after an amount of time $\Delta t$, the simplified flux tuner circuit 100 is used to shift flux from the flux bank inductor $L_b$ 104 in series with the main inductor $L_m$ 102 in order to return the main inductor $L_m$ 102 to its original current $I_0$. Over this period of time, the relative change in total flux is $$\left(\frac{\Delta\phi_{tot}}{\phi_{tot}}\right)_{dissipated} = e^{-\frac{\Delta t}{\tau}} - 1, \tag{22}$$

which is the same for both the main inductor $L_m$ 102 and flux bank inductor $L_b$ 104 since nothing is disrupting the balance of flux between them, making $$\left(\frac{\Delta\phi_m}{\phi_m}\right)_{dissipated} = \left(\frac{\Delta\phi_b}{\phi_b}\right)_{dissipated} = \left(\frac{\Delta\phi_{tot}}{\phi_{tot}}\right)_{dissipated}. \tag{23}$$

If the assumption is made that the inductance of the flux bank inductor $L_b$ 104 is changed quickly enough that an instantaneous shift in flux is valid, then Equation 18 can be used to find the change in the flux bank inductance that will shift an amount of flux to the device to exactly balance what has been lost during the time $\Delta t$. This change is $$\frac{\Delta L}{L_m + L_b} = e^{-\frac{\Delta t}{\tau}} - 1. \tag{24}$$

Most persistent devices require operating within a specific range of current. For this study it will be assumed that a change from the nominal current $I_0$ of more than $\Delta I_{tol}$ moves the current outside the operating range. In this case, the decay can be stabilized by "bumping" up the current by $\Delta I_{tol}$ in a time increment $$\Delta t = -\tau \ln\left[\frac{\Delta I_{tol}}{I_0} + 1\right]. \tag{25}$$

This is illustrated in FIG. 3, where the current decay is shown stabilized within $$\frac{\Delta I}{I_0} < 10^{-9}$$

for a total inductance of 10 mH and resistance of $10^{-13}\Omega$ (resulting in a "pumping" time $\Delta t$ of 100 s).

If the magnet is to be operated over a period of time, this "bumping" process will occur many times. Over the course of operation, the inductance of the flux bank inductor $L_b$ 104 will be continually reduced to supply flux to the main inductor $L_m$ 102. A comparison between Equation 24 and Equation 25 shows that the relative change in flux bank inductance will be the same for each bump, and given by $$\frac{\Delta L}{L_m + L_b} = \frac{\Delta I_{tol}}{I_0}, \tag{26}$$

where $L_b$ is the inductance of the bank before the bump. For completeness, it should be mentioned that the absolute change in bank inductance is not constant bump to bump, as the pre-bump bank inductance is lower after each bump. The absolute change for the "$i^{th}$" bump, normalized to the initial inductance of the bank $L_{b0}$, is given by $$\frac{\Delta L_i}{L_m + L_{b0}} = \frac{\Delta I_{tol}}{I_0} + \sum_{n=2}^{i}(i - n + 1)\left(\frac{\Delta I_{tol}}{I_0}\right)^n. \tag{27}$$

Given that $$\frac{\Delta I_{tol}}{I_0}$$

is typically very small (pans per million or less), the leading order term will almost always be sufficient, making the assumption of a fixed inductance change per bump of $$\frac{\Delta L}{L_m + L_{b0}} \approx \frac{\Delta I_{tol}}{I_0} \tag{28}$$

an accurate assumption. With the same assumption, a fixed time step between adjustments can be found using Equation 25 and a fixed time constant of $$\tau_0 = \frac{(L_m + L_{b0})}{R}.$$

The main inductor $L_m$ 102 device design and operating conditions define the specifications for tuning. The key specifications are the allowable deviation from the nominal current $$\frac{\Delta I_{tol}}{I_0}$$

and a total time for which this condition is to be maintained $\Delta t_{stab}$. This represents the time for which the device would operate in persistent mode before resetting the current with a PCS and outside power supply. With the assumption of small $$\frac{\Delta I_{tol}}{I_0},$$

the time between adjustments of size $$\frac{\Delta L_{step}}{L_m + L_{b0}} \approx \frac{\Delta I_{tol}}{I_0}, \tag{29}$$

is $$\Delta t \approx -\frac{L_m + L_{b0}}{R} \ln\left[\frac{\Delta I_{tol}}{I_0} + 1\right]. \tag{30}$$

This allows for writing the total inductance change over the course the operating period in terms of the operation specifications and residual resistance as $$\Delta L_{tot} = \Delta L_{step}\frac{\Delta t_{stab}}{\Delta t} = -\Delta t_{stab}R\frac{\dfrac{\Delta I_{tol}}{I_0}}{\ln\left[\dfrac{\Delta I_{tol}}{I_0} + 1\right]}. \tag{31}$$

Equation 29 and Equation 31 set the specifications for the flux tuner circuit 100 design, giving the minimum required step size and total range it must operate within.

The most prolific need for persistent current stabilization against decay is found in the magnetic resonance imaging (MRI) and nuclear magnetic resonance (NMR) communities. This has motivated the development of many flux pumping techniques that bring in new flux from outside of the cryostat in order to stabilize these magnets within a certain operating range. The largest market for commercial MRI is made up of 1.5-3 T Nb—Ti magnets, for which the "digital flux injector" flux pump approach developed by Iwasa appears to be in use for compensation of persistent current decay (Y. Iwasa. Microampere Flux Pumps for superconducting NMR Magnets Part 1: Basic Concept and Microtesla Flux measurement," Cryogenics, vol. 41, no. 5-6, pp. 385-391, 2001.)

Stabilization against decay is even more important for MRI or NMR magnets that incorporate high temperature superconductors (HTS) or other non Nb—Ti superconductors. This is due to the techniques for fabricating superconducting joints with HTS materials producing joint resistances much higher than Nb—Ti and lower "n" value conductors increasing the loss within the conductor itself. As a start, the operating specifications for the first two use cases studied in this note are summarized in Table 1. These are the stabilization of a superconducting transmission electron microscopy (TEM) lens and a typical Nb—Ti MRI magnet. The first design of a stabilization system for these applications is presented in Sections 8 and 9 below.

4. A Simple Variable Inductor Model

There are many possibilities for varying the inductance of the system. In this case a C-shaped yoke magnet is presented as an example that is easy to understand and possibly fabricate for a first test of the concept. The simple geometry also allows for a study of the scaling of the device analytically.

Figure 4:
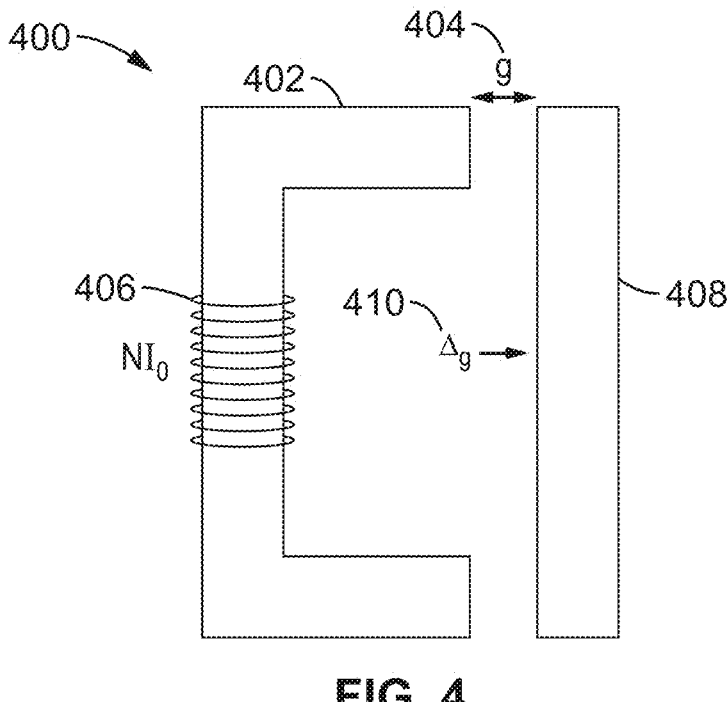
FIG. 4 is a layout of a variable inductor comprising a C-shaped yoke with N turns wrapped about it, an adjustable return gap, and a return yoke completing the magnetic circuit.

Refer now to FIG. 4, which is a layout of a variable inductor 400 comprising a C-shaped yoke 402 with an adjustable return gap 404. Here, the C-shaped yoke 402 has N turns 406 wrapped about it. A return yoke 408 completes the magnetic circuit. The return gap 404 movement 410 could be controlled by a linear actuator, linear stage, or some other cryogenically compatible positioning device, not shown here.

A very large permeability is assumed for the iron such that $\vec{H}$ is zero inside the yoke and the field $\vec{B}$ has no tangential component at the yoke surface (only normal). With these assumptions, the field in the gap (perpendicular to the iron poles) is found from $$\oint \vec{H} \cdot d\vec{l} = NI, \tag{32}$$

as $$B = \frac{\mu_0 NI}{2g}. \tag{33}$$

If the area of the pole is defined as A, the flux is $$\phi_0 = \frac{\mu_0 NIA}{2g}, \tag{34}$$

making the inductance $$L_b = \frac{N\phi_0}{I} = \frac{\mu_0 N^2 A}{2g}. \tag{35}$$

The total force on the "I" return yoke can be found from Maxwell's stress tensor at the two poles, which in this 1D case is simply $$F = \frac{B^2}{2\mu_0}2A = \frac{B^2 A}{\mu_0}. \tag{36}$$

Now the case where the "I" beam is allowed to move by a distance $\Delta g$ can be examined to find the relation between this movement and change in inductance required for tuning the persistent current. In this case the variation of the inductance is $$L_b + \Delta L = \frac{\mu_0 N^2 A}{2(g + \Delta g)} = L_b \left( \frac{1}{1 + \frac{\Delta g}{g}} \right), \tag{37}$$

$$\frac{\Delta L}{L_b} = \left( \frac{1}{1 + \frac{\Delta g}{g}} \right) - 1 = -\frac{\frac{\Delta g}{g}}{1 + \frac{\Delta g}{g}}. \tag{38}$$

5. Flux Tuning with the Simple Inductor Model

Figure 5:
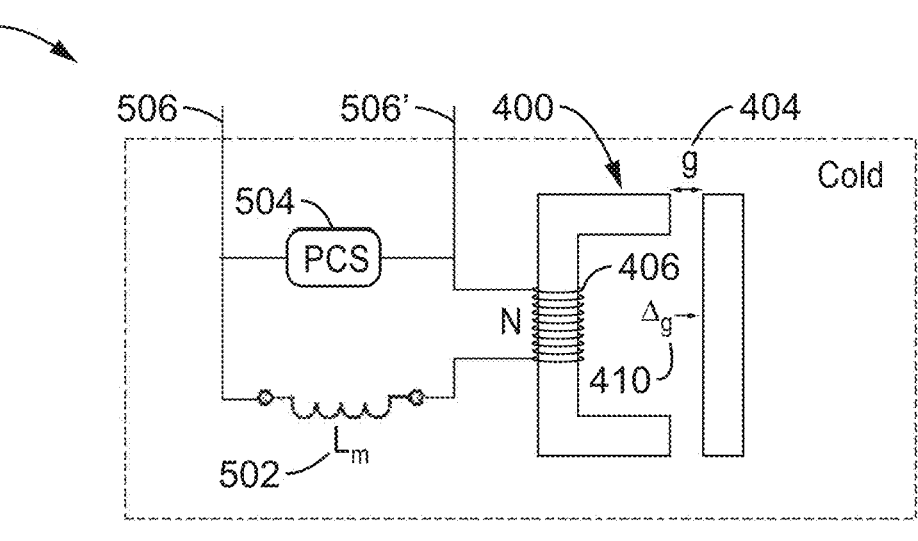
FIG. 5 is a simplified schematic of an inductive device (of inductance $L_m$) placed in series with the simple variable inductor described in FIG. 4.

Refer now to FIG. 4 and FIG. 5. FIG. 5 is a simplified schematic 500 of an inductive device 502 (of inductance $L_m$) placed in series with the simple variable inductor 400 described in Section 4 and FIG. 4. A persistent current switch (PCS) 504 shorts the leads 506, 506', allowing for an initial current to be injected using a power supply when the switch is quenched. The basic relations found in the previous sections can be applied to the circuit set up seen in FIG. 5. The closed superconducting loop conserves flux (ignoring the small joint resistance of the PCS for now) with an amount of "extra" flux now stored in the "flux bank" of the variable inductor 400. After the initial current is injected and the switch is closed, the inductance of the variable inductor 400 can be changed to shift flux back and forth to tune the value of the persistent current within the inductive device 502.

Once the design is fixed, there is only a single adjustment mechanism for tuning the current (changing the gap by $\Delta g$ 410). From Equation 10, Equation 13, and Equation 38, it can be shown that $$\frac{\Delta I}{I_0} = \frac{L_b}{L_m} \frac{\Delta g}{g} \left( \frac{1}{1 + \frac{\Delta g}{g} + \frac{L_b}{L_m}} \right). \tag{39}$$

In most cases the "extra" flux needed for tuning will be small with respect to the main inductive device 502. If the stored energy is to be minimized, this allows for $L_m \gg L_b$. In this limit, $$\frac{\Delta I}{I_0} \approx \frac{I_b}{I_m} \frac{\Delta g}{g} \left( \frac{1}{1 + \frac{\Delta g}{g}} \right). \tag{40}$$

The further limit of a small relative gap movement $$\frac{\Delta g}{g} \ll 1,$$

which allows for tuning over a large range with respect to the desired tuning increment, gives, $$\frac{\Delta I}{I_0} \approx \frac{L_b}{L_m} \frac{\Delta g}{g}. \tag{41}$$

Here, the initial inductance ratio $$\frac{L_b}{L_m}$$

directly states of the sensitivity between current and relative gap change. This gives flexibility in the design of the desired precision of the tuner. In fact, it allows for there to be several tuners in series with inductance ratios allowing both "rough" and "fine" tuning as desired.

6. Cryogenic Actuators

The design of the simple tunable inductor shown in FIG. 4 must be compatible with available cryogenic actuators used to change the gap 404. An existing and available actuator is chosen as a representative example. This is a "CLA MARKII" linear actuator sold by the commercial vendor Janssen Precision Engineering. The relevant properties of this device are given in Table 2.

7. Design of the Tuner

Table 3 summarizes the free variables for the example c-shaped tuner described in Section 4 as well as the variables which are fixed by the operating conditions of the main device. Equation 39 can be re-written in terms of the free design variables as $$\frac{\Delta I}{I_0}(g, A, N) = \frac{L_b(g, A, N)}{L_m} \frac{\Delta g}{g} \left( \frac{1}{1 + \frac{\Delta g}{g} + \frac{L_b(g, A, N)}{L_m}} \right), \tag{42}$$

with Equation 35 giving $$L_b(g, A, N) = \frac{\mu_0}{2} \frac{AN^2}{g}. \tag{43}$$

The desired range of operation constricts a single move to be less than $$\frac{L_b(g, A, N)}{L_m} \frac{\Delta g}{g} \left( \frac{1}{1 + \frac{\Delta g}{g} + \frac{L_b(g, A, N)}{L_m}} \right) \leq \left( \frac{\Delta I}{I_0} \right)_{max}. \tag{44}$$

Saturation of the iron yoke at a field of $B_{sat}$ and force limitation of the cryogenic actuator $F_{max}$ also place limits on the design variables. Equation 33 and Equation 36 give the following restrictions $$B(g, N) = \frac{\mu_0 I}{2} \frac{N}{g} < B_{sat} \tag{45}$$

$$F(g, A, N) = \frac{B^2 A}{\mu_0} = \frac{\mu_0 I^2}{4} \frac{AN^2}{g^2} < F_{max}. \tag{46}$$

In addition to this, the total required movement during the time of operation actuator must be within the operable range.

8. Design for Stabilization of a TEM Lens

The assumptions for the stabilization of a TEM lens are given in Table 4.

The time between adjustments is dependent on the circuit resistance and the desired stabilization range. This time increment can be used to calculate the total number of adjustments necessary over the stabilization period assuming the magnet inductance is much larger than the bank inductance. Table 5 lists the time between adjustments, total adjustments, and maximum allowable single adjustment step to not run out of the range limitation of the linear actuator. This shows that if one wants to account for a worst-case joint resistance of $10^{-12}\Omega$ they should design the flux tuner for single step size correction of around 0.5 μm or smaller.

The scaling of the tuner performance with design variables is now analyzed. From Equation 41 and the rest of the assumptions, a ratio of the bank inductance to the initial gap is desired which is of order $$\frac{L_b}{g} \approx \frac{\Delta I_{tol}}{I_0}\frac{L_m}{\Delta g} \approx \frac{10^{-11}}{\Delta g}H. \qquad (47)$$

A key design choice is the ratio of the tuner pole face area to the initial gap. If this ratio is defined with a variable $f_{pg}$, such $$A = f_{pg}^2 g^2, $$

$$\frac{L_b}{g} = \frac{\mu_0}{2}\frac{A}{g^2}N^2 = \frac{\mu_0}{2}f_{pg}^2N^2. \qquad (48)$$

If the pole is square, $f_{pg}$ is simply the ratio between the pole width and initial gap. With these assumptions, the design choices for the tuner can be reduced to this ratio $f_{pg}$ and the number of turns N. This relation is given by $$\frac{\mu_0}{2}f_{pg}^2N^2 \approx \frac{\Delta I_{tol}}{I_0}\frac{L_m}{\Delta g}. \qquad (49)$$

Curves of N vs. $\Delta$g can be plotted for given choices of $f_{pg}$. This is practical since $f_{pg}$ is likely limited from becoming too large by physical constraints, and also should not be too small that fringe fields change the scaling of the inductance.

Figure 6:
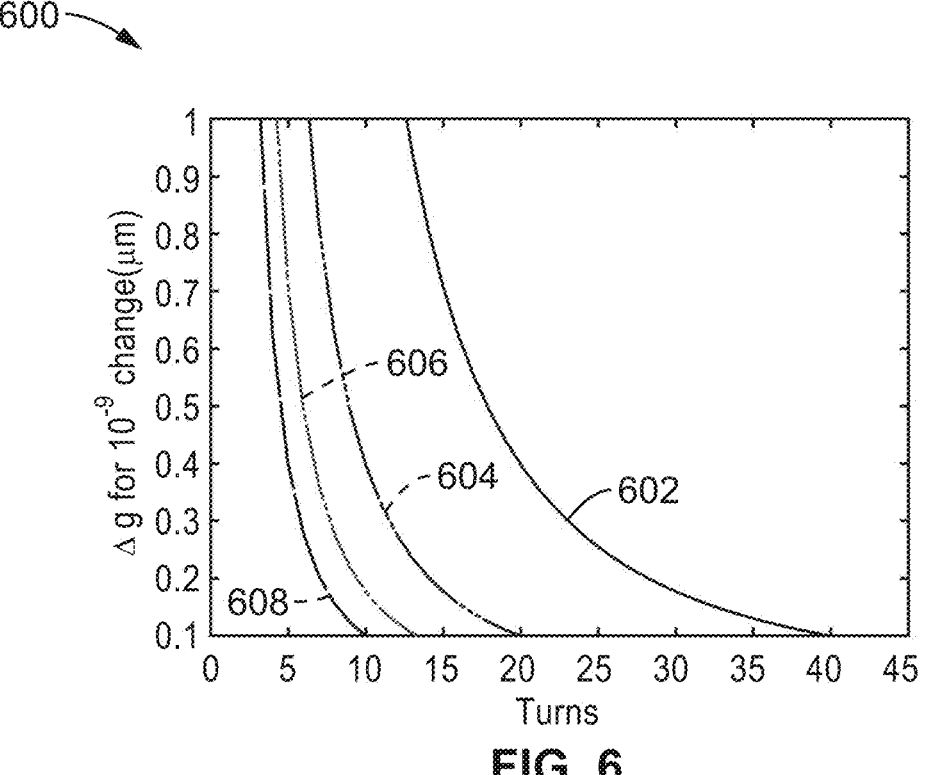
FIG. 6 is a plot of several of $f_{pg}$ curves for values of 1, 2, 3, and 4 near the maximum $\Delta g$.

Refer now to FIG. 6, which plots 600 several of these of $f_{pg}$ curves near the maximum $\Delta$g calculated from the total movement. Here, curves of $f_{pg}$ for values of 1, 2, 3, and 4 are shown in 602, 604, 606, and 608, respectively.

From Equation 36, it is clear the force can be written as a function of $\Delta$g only, $$F(\Delta g) = \frac{\mu_0 I^2}{4}\frac{AN^2}{g^2} = \frac{\mu_0 I^2}{4}f_{pg}^2N^2 = \frac{I^2}{2}\frac{\Delta I_{tol}}{I_0}\frac{L_m}{\Delta g} < F_{max}. \qquad (50)$$

Figure 7:
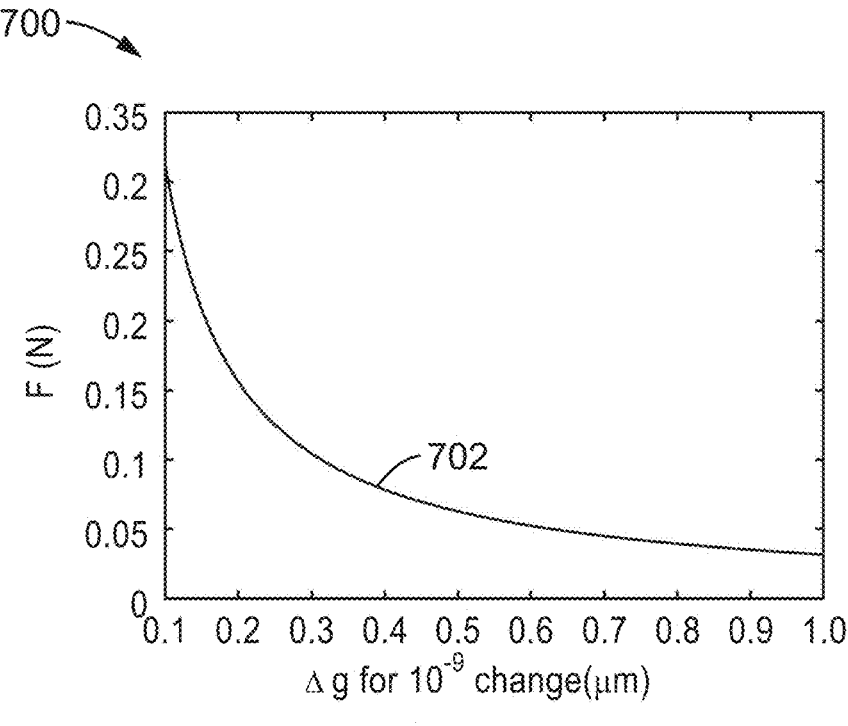
FIG. 7 is a plot 700 of F($\Delta g$) force versus the choice of $\Delta g$, showing the force to be below the 20 N force limit of the linear actuator for the range of interest.

Refer now to FIG. 7, which shows a plot 700 of this force versus the choice of $\Delta$g. This plot 702 clearly shows F($\Delta$g) to be below the 20 N force limit of the linear actuator for the range of interest.

The limitation of the magnetic field to avoid saturation in the yoke scales linearly with the number of turns as given in Equation 45. This can be plotted over the range of turn interest given by FIG. 6 for different initial starting gaps.

Figure 8:
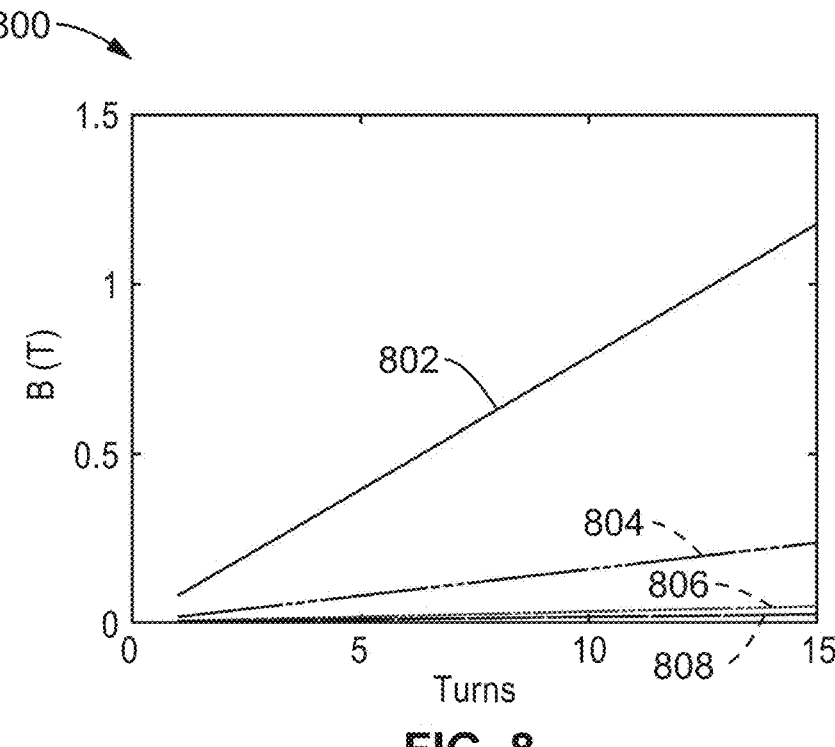
FIG. 8 is a plot of field strength B(T) versus the number of turns $N_{turns}$ for a variety of gaps.

Refer now to FIG. 8, which is a plot 800 of field strength B(T) versus the number of turns $N_{turns}$ for a variety of gaps 0.15 mm (802), 1 mm (804), 5 mm ((806), and 10 mm (808). From this, it is clear that an initial gap of larger than 0.15 mm is sufficient to stay away from saturation issues in the c-shaped yoke.

For a first design, one could pick a $\Delta$g of 0.25 μm, an initial gap of 3 mm, and 4 turns (resulting in a pole to gap fraction of 2.0). With these choices, the critical parameters of this design are given below in Table 6.

A finite element model (FEM) of the tuner and stabilization process was built using the commercial FEM software ANSYS to verify the tuner stabilization behavior.

Figure 9:
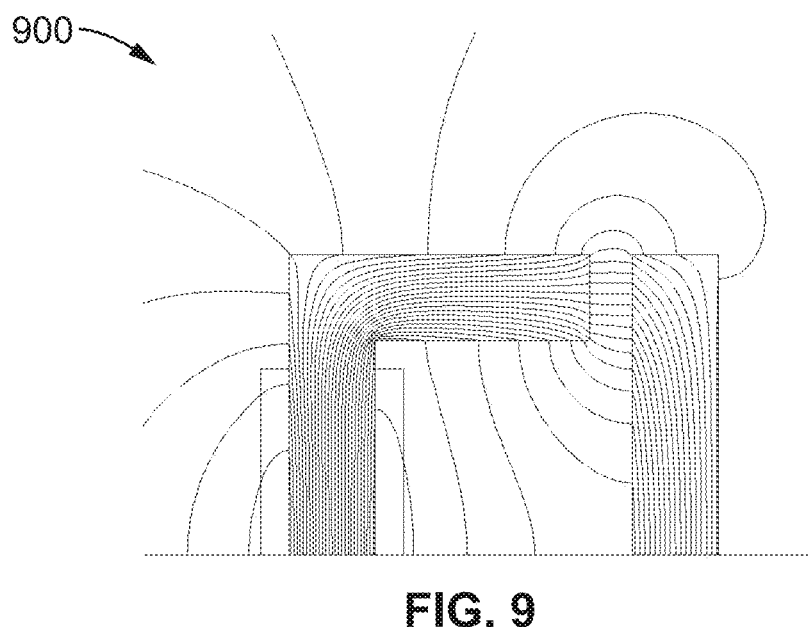
FIG. 9 is a finite element modeled plot of a simulated flux in a design of the variable inductor of FIG. 4 assuming low carbon 1006 steel for the yoke material.

Refer now to FIG. 9, which shows 900 a simulated flux in this design assuming low carbon 1006 steel for the yoke material. The implications of finite permeability material are clear, with flux returning by paths other than the yoke and the gap. This results in more flux linkage through the coil, which increases the inductance with respect to the idealized infinite permeability case. To account for this, a factor $f_\phi$ is defined as the ratio of flux through the coil in a real device (as determined from a finite element model) to the idealized $\mu=\infty$ case. With this assumption, the inductance of a real device is $$L_b = Nf_\phi(L_b)|_{\mu=\infty}. \qquad (51)$$

The results of the finite element model for the other parameters are shown in Table 7. For this case $f_\phi=3.14$. This results in a decrease of the step size for a minimum adjustment as $$\Delta g = \frac{1}{f_\phi}(\Delta g)|_{\mu=\infty}. \qquad (52)$$

In practice, a design approach using the FEM model can be used to get the inductance in the right regime. After the device is built it can be characterized before and during operation. Since the linear actuator is flexible in step size, the final values used can be determined based on device behavior.

9. Design for Stabilization of an MRI

The assumptions for the stabilization of a MRI magnet are given in Table 8, with the magnet parameters set by a 1.5 T whole body MRI. A somewhat arbitrary adjustment interval of one week is assumed along with a total stabilization time of two years. The tuner design for a large magnet benefits from a longer length of travel and a higher standoff force when compared to the smaller electron microscope. For this reason, a long stroke, high force actuator is assumed. Even for these assumptions, there appear to be commercial products available. In reality, it is important to remember that the force restriction may be partially overcome by a spring balance.

For the MRI case it is assumed the time between adjustments is fixed at one week. Using this time and the worst of the range of joint resistances assumed to be $10^{-12}\Omega$, the weekly "bump" in terms of relative current can be calculated as $$\frac{\Delta I_{tol}}{I_0} = 2.4 \times 10^{-8}.$$

Given the 50 mm limit on the travel range and the total stabilization time of two years, the individual increment must be less than $$\Delta g < \frac{50 \text{ mm}}{104} = .48 \text{ mm}.$$

The scaling of the tuner performance with design variables is now analyzed. A key design choice is the ratio of the tuner pole face area to the initial gap. If this ratio is defined with a variable $f_{pg}$, such $$A = f_{pg}^2 g^2,$$

$$\frac{L_b}{g} = \frac{\mu_0}{2} \frac{A}{g^2} N^2 = \frac{\mu_0}{2} f_{pg}^2 N^2. \tag{53}$$

If the pole is square, $f_{pg}$ is simply the ratio between the pole width and initial gap. With these assumptions, the design choices for the tuner can be reduced to this ratio $f_{pg}$ and the number of turns N. This relation is given by $$\frac{\mu_0}{2} f_{pg}^2 N^2 \approx \frac{\Delta I_{tol}}{I_0} \frac{L_m}{\Delta g}. \tag{54}$$

Figure 10:
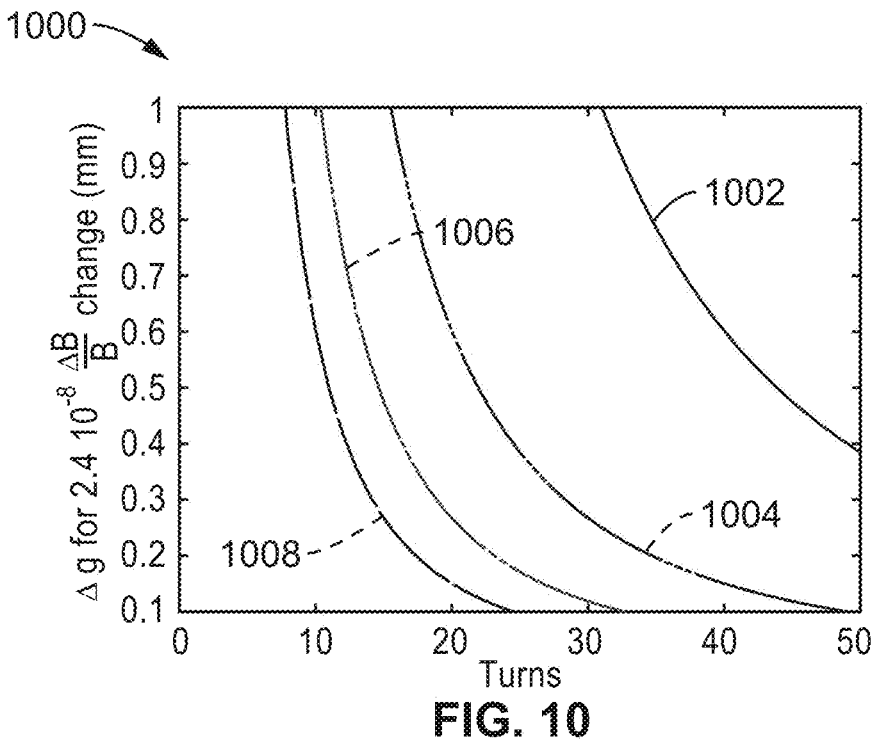
FIG. 10 is a plot of several of $f_{pg}$ curves for values of 1, 2, 3, and 4 near the maximum $\Delta g$.

Curves of N vs. $\Delta g$ can be plotted for given choices of $f_{pg}$. This is practical since $f_{pg}$ is likely limited from becoming too large by physical constraints, and also should not be too small that fringe fields change the scaling of the inductance. Refer now to FIG. 10, which is a plot of 1000 several of $f_{pg}$ curves for values of 1, 2, 3, and 4 near the maximum $\Delta g$ calculated from the total movement. Here, curves of $f_{pg}$ for values of 1, 2, 3, and 4 are shown in 1002, 1004, 1006, and 1008, respectively, based on a maximum $\Delta g$ in for a 2.4× $10^{-6}$ mm change.

From Equation 36 it is clear the force can be written as a function of $\Delta g$ only, $$F(\Delta g) = \frac{\mu_0 I^2}{4} \frac{A N^2}{g^2} = \frac{\mu_0 I^2}{4} f_{pg}^2 N^2 = \frac{I^2}{2} \frac{\Delta I_{tol}}{I_0} \frac{L_m}{\Delta g} < F_{max}. \tag{55}$$

Figure 11:
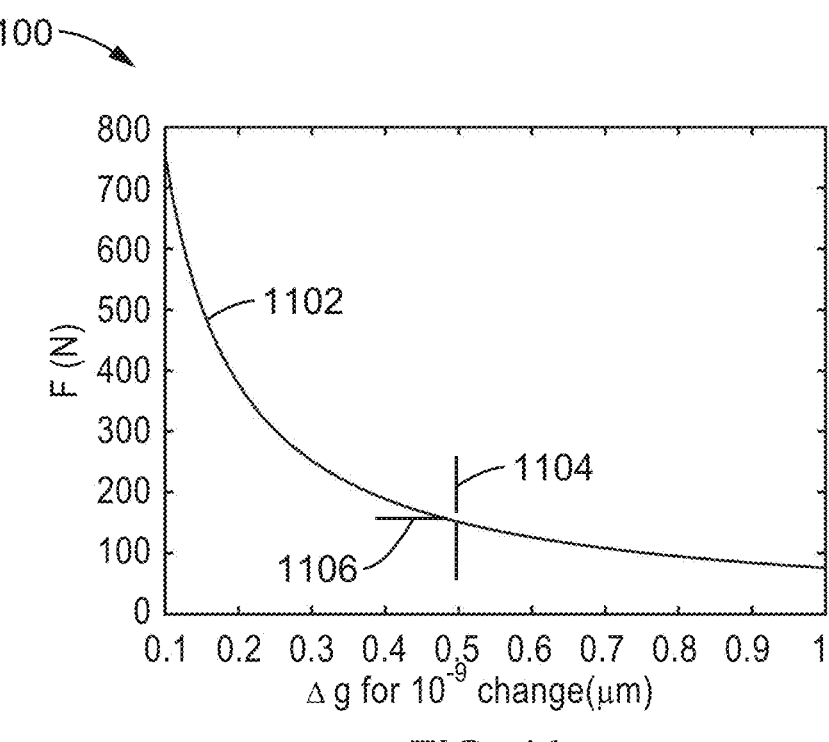
FIG. 11 is a plot of force (in N) against the choice of $\Delta g$ showing that at the desired movement amount of 0.5 mm appears to be below the 200 N force limit.

Refer now to FIG. 11, which is a graph 1100 of a plot 1102 of force (in N) against the choice of $\Delta g$ that at the desired movement amount of 0.5 mm 1104 appears to be below 1106 the 200 N force limit.

The limitation of the magnetic field to avoid saturation in the yoke scales linearly with the number of turns as given in Equation 45. This can be plotted over the range of turn interest given by FIG. 10 for different initial starting gaps.

Figure 12:
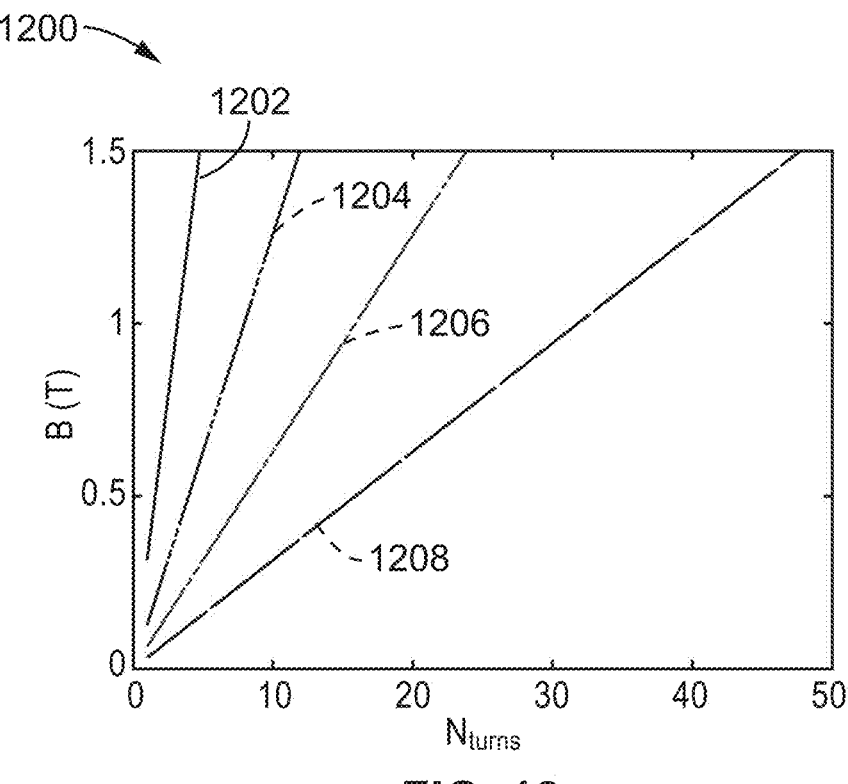
FIG. 12 is a plot of field strength B(T) versus the number of turns $N_{turns}$ for a variety of gaps of 1, 2.5, 5, and 10 mm.

Refer now to FIG. 12, which is a graph 1200 of field strength B(T) versus the number of turns $N_{turns}$ for a variety of gaps of 1, 2.5, 5, and 10 mm, which are respectively graphs 1202, 1204, 1206, and 1208.

For a first design, a gap $\Delta g$ of 0.4 mm, an initial gap of 7 mm, and 8 turns (resulting in a pole to gap fraction of 6.1) are picked. With these choices, the critical parameters of this design are given below in Table 9.

A finite element model (FEM) of the tuner and stabilization process was built using the commercial FEM software ANSYS to verify the behavior.

Figure 13:
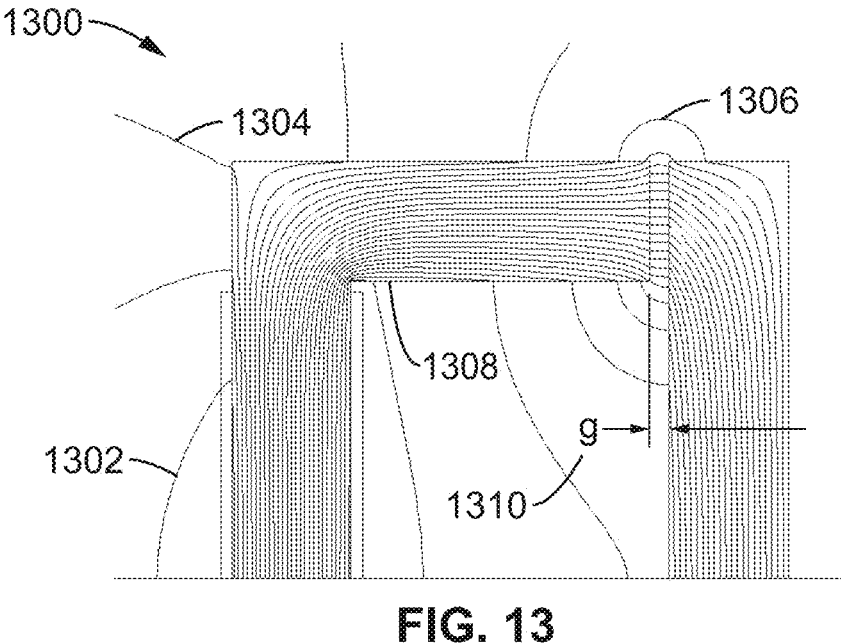
FIG. 13 is a finite element modeled plot of a simulated flux in an MRI stabilization design of the variable inductor of FIG. 4 assuming low carbon 1006 steel for the yoke material.

Refer now to FIG. 13, which shows 1300 the simulated flux in this design assuming low carbon 1006 steel for the yoke material. The implications of finite permeability material are clear, with flux returning by paths 1302, 1304, 1306 other than the desired yoke 1308 and the gap 1310. This results in more flux linkage through the coil, which increases the inductance with respect the idealized infinite permeability case. To account for this, a factor $f_\phi$ is defined as the ratio of flux through the coil in a real device (as determined from a finite element model) to the idealized $\mu = \infty$ case. With this assumption, the inductance of a real device is $$L_b = N f_\phi (L_b)|_{\mu=\infty}. \tag{56}$$

The results of the finite element model for the other parameters are shown in Table 10. For this case $f_\phi = 1.83$. This results in a decrease of the step size for a minimum adjustment as $$\Delta g = \frac{1}{f_\phi} (\Delta g)|_{\mu=\infty}. \tag{57}$$

In practice, a design approach using the FEM model can be used to get the inductance in the right regime. After the device is built it can be characterized before and during operation. Since the linear actuator is flexible in step size, the final values used can be determined based on the actual implemented device behavior.

10. Checking with a Circuit-Coupled FEM Model

Figure 14:
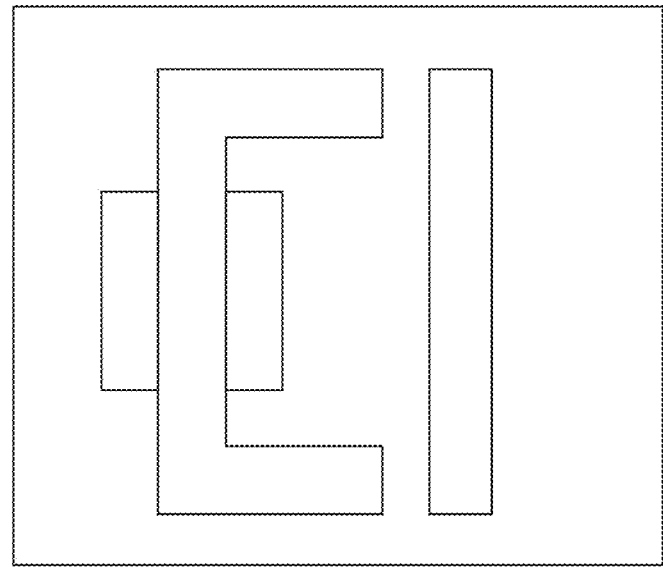
FIG. 14 is a finite element model of the MRI stabilization flux tuner that was coupled to a simple circuit comprising a resistor (to represent the residual resistance in the circuit) and an inductor which represents the main device (similar to FIG. 5, but with a resistor added in series).

Refer now to FIG. 14, which is a finite element model of the MRI stabilization flux tuner that was coupled to a simple circuit comprising a resistor (to represent the residual resistance in the circuit) and an inductor which represents the main device (similar to FIG. 5, but with a resistor added in series). The basis of the design studied is the TEM tuner presented in Section 8, but in this case the tuner inductance and step size were scaled to avoid numerical issues with small numbers in the simulation. The tuner was simply scaled by allowing the length to increase to 1 m. The parameters used for this simulation are given in Table 11.

Figure 15:
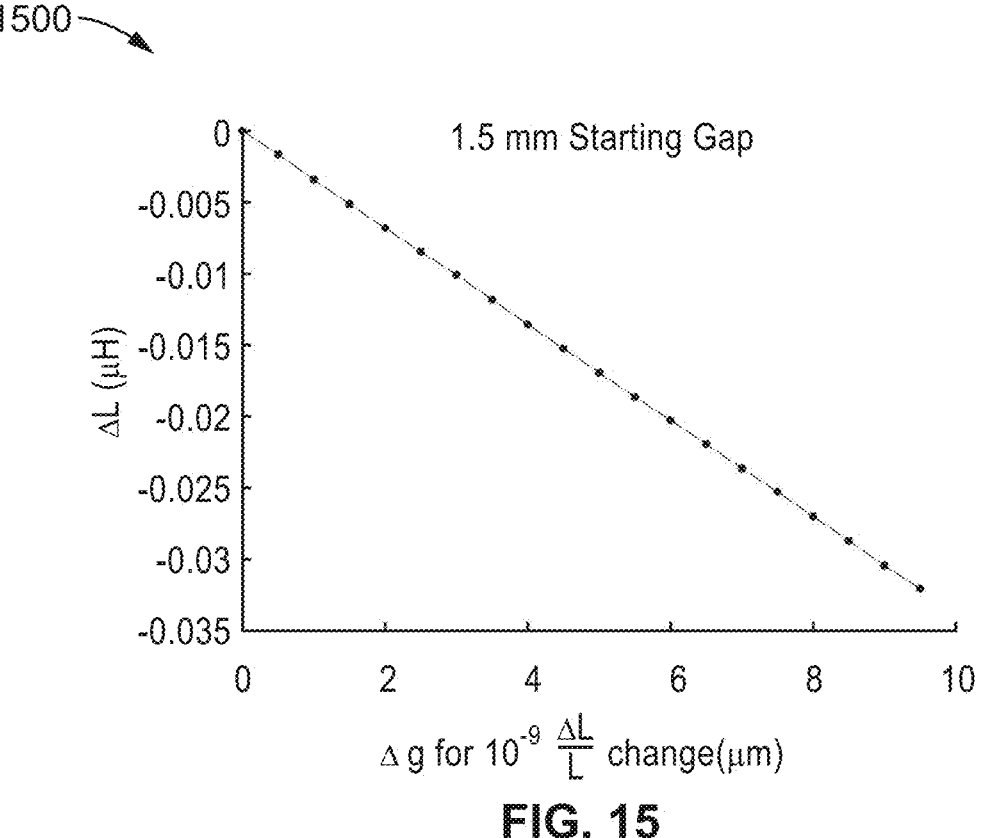
FIG. 15 is a graph of the change in inductance of the tunable inductor characterized about a nominal 1.5 mm starting gap.

Refer now to FIG. 15, which is a graph 1500 of the change in inductance of the tunable inductor characterized about the nominal 1.5 mm starting gap. The gap was increased over a range of values to find the resulting change in inductance. From the parameters and this figure, the change in gap required for single bump up of the current can be estimated using Equation 29. In this case, the desired inductance change is −0.1 µH, which by extrapolating a linear behavior from the plot, would correspond to a gap change of 29.7 µm (neither of which are shown in the FIG. 15 graph 1500).

Figure 16A:
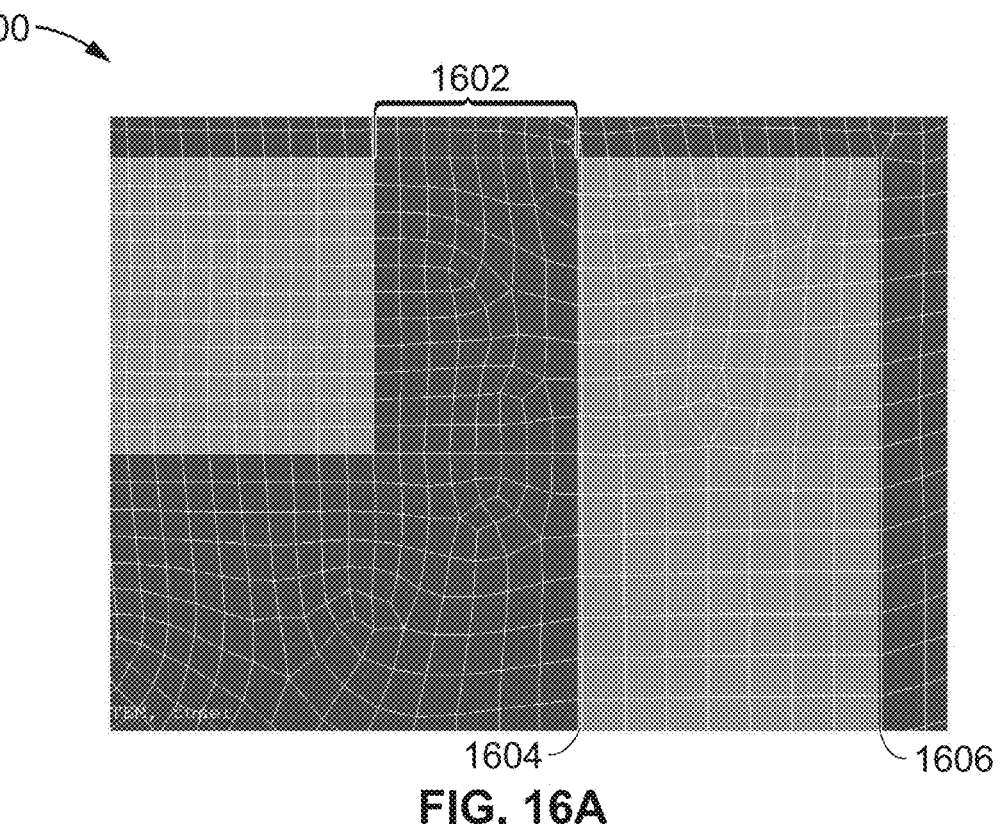
FIG. 16A is an FEM model simulating the gap change behavior of the device of FIG. 14, with a layer of elements created on either side of a movable yoke, first with a thin layer of iron on the left side and a thin layer of air on the right side.
Figure 16B:
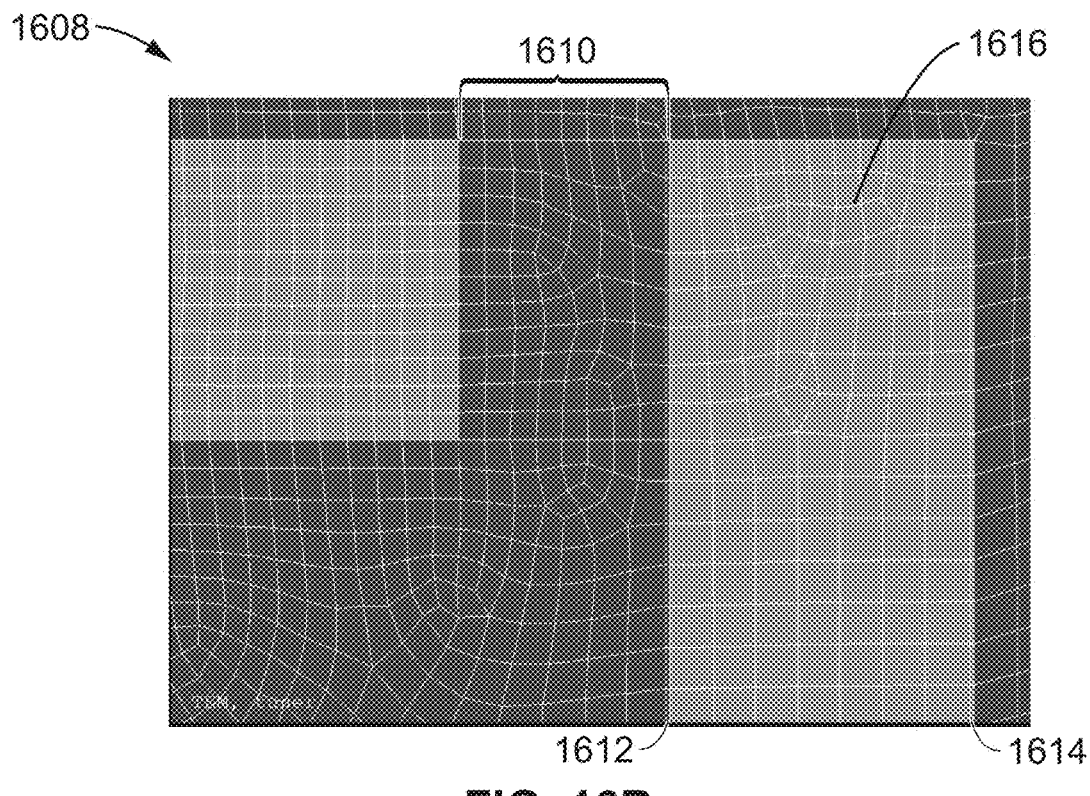
FIG. 16B is an FEM model simulating the gap change behavior of the device of FIG. 16A, but with a layer of elements created on either side of a movable yoke, now with a thin layer of air on the left side and a thin layer of iron on the right side.

Refer now to FIG. 16A and FIG. 16B, which simulate the gap change behavior of the device of FIG. 14. Here, a layer of elements was created on either side of the movable block. In FIG. 16A, the device 1600 gap 1602 is modelled with a thin layer of iron 1604 on the left side and a thin layer of air 1606 on the right side. The material properties of this layer can be changed from air to iron during the solution in order to simulate the gap changing.

In FIG. 16B, the device 1608 thin layers of iron and air were reversed so as to change the gap by 29.7 μm. The new gap 1610 FEM model was allowed to decay until a $10^{-5}$ change in current occurred. Then, the material properties of the thin layers were adjusted to increase the gap 1610 by the aforementioned amount with a thin layer of air 1612 on the left side, and a thin layer of iron 1614 on the right side. This change in material properties effects the movement of the bar yoke 1616 to the right by 29.7 μm, increasing the gap 1610 by that amount. The FEM model was then allowed to decay again until a relative change of $10^{-5}$ in current occurred.

Figure 17:
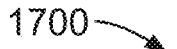
FIG. 17 is a plot of the current versus time from the FEM model analyzed in FIG. 16A and FIG. 16B, compared to the expectation for the stabilization process.
Figure 17:
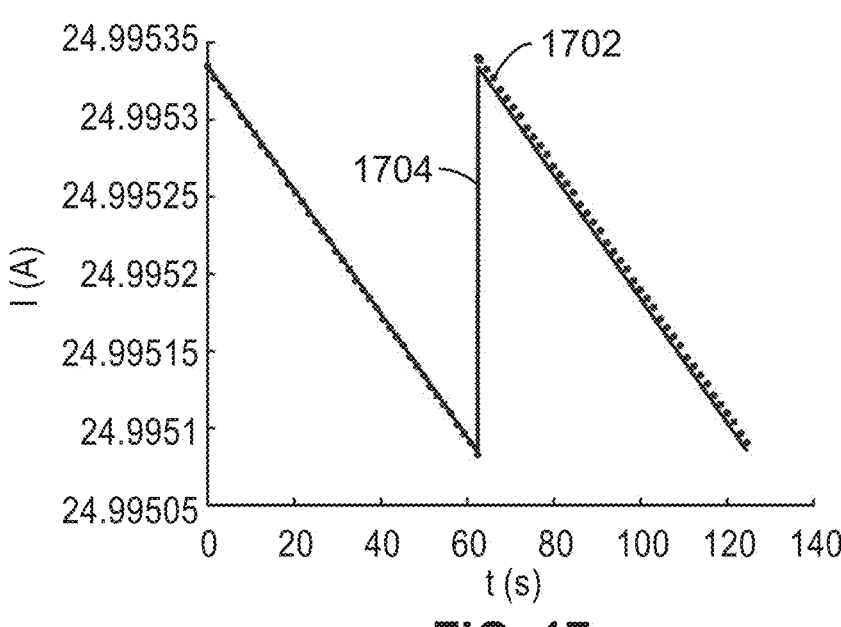

Refer now to FIG. 17, which is a plot 1700 of the current as a function of time from the FEM model (dots 1702) compared to the expected analytical solution 1704 for the stabilization process. The FEM model 1702 agrees quite well with the predicted values 1704, and clearly shows how an appropriately sized change in gap can "bump" up the current to the original level.

11. Conclusion

Variable inductance was presented as an alternative to flux pumping for adjusting persistent current circuits. This allows for tuning of the current without bringing in new flux from outside of the cryostat. In practice, this means the tuning can be done without breaking the superconducting circuit using thermal switches, showing promise for faster and higher accuracy adjustments. This application presented the basic concept and relations helpful for designing a tuning device. In addition, the application presented a first tuning system design for an electron microscope lens and an MRI magnet. Finally, the derived relations were checked for a single case with a finite element model.

12. Voltage Tunable Inductors for Control of Persistent Current

Recent laboratory testing in a liquid helium cryostat at 4.5° K has shown excellent results for the control of persistent currents.

Figure 18A:
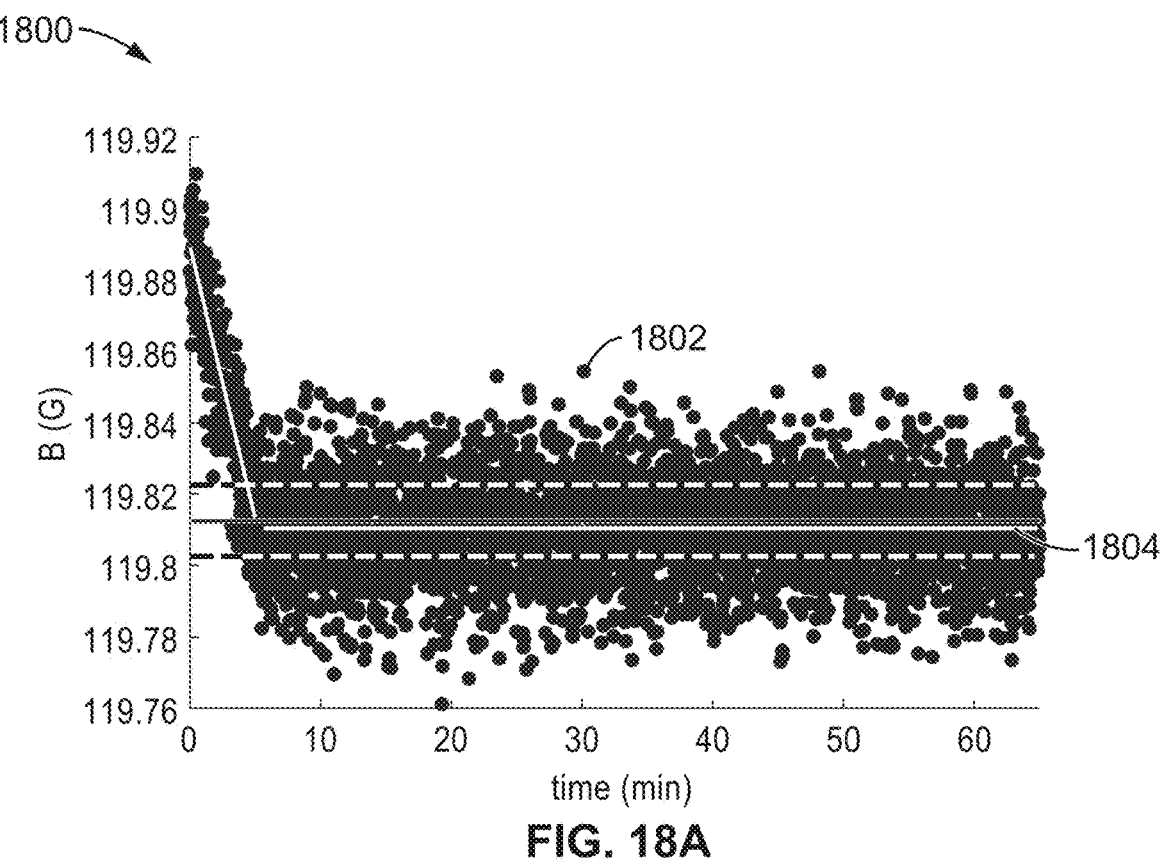
FIG. 18A is a graph of field strength versus time is shown for control of persistent currents at 4.5° K.

Refer now to FIG. 18A, where a graph 1800 of field strength versus time is shown. Here, instantaneous field strengths 1802 within a magnet are measured with a cryogenic hall probe from the commercial vendor Lakeshore. A moving average 1804 of these instantaneous field strength 1802 measurements is also shown. A curve fitting of this data results in a fitted decay rate resistance of $R_{fit}=7.4052\times10^{-12}\Omega$, and a fitted stability of $R_{fit}=-2.5722\times10^{-15}\Omega$.

Figure 18B:
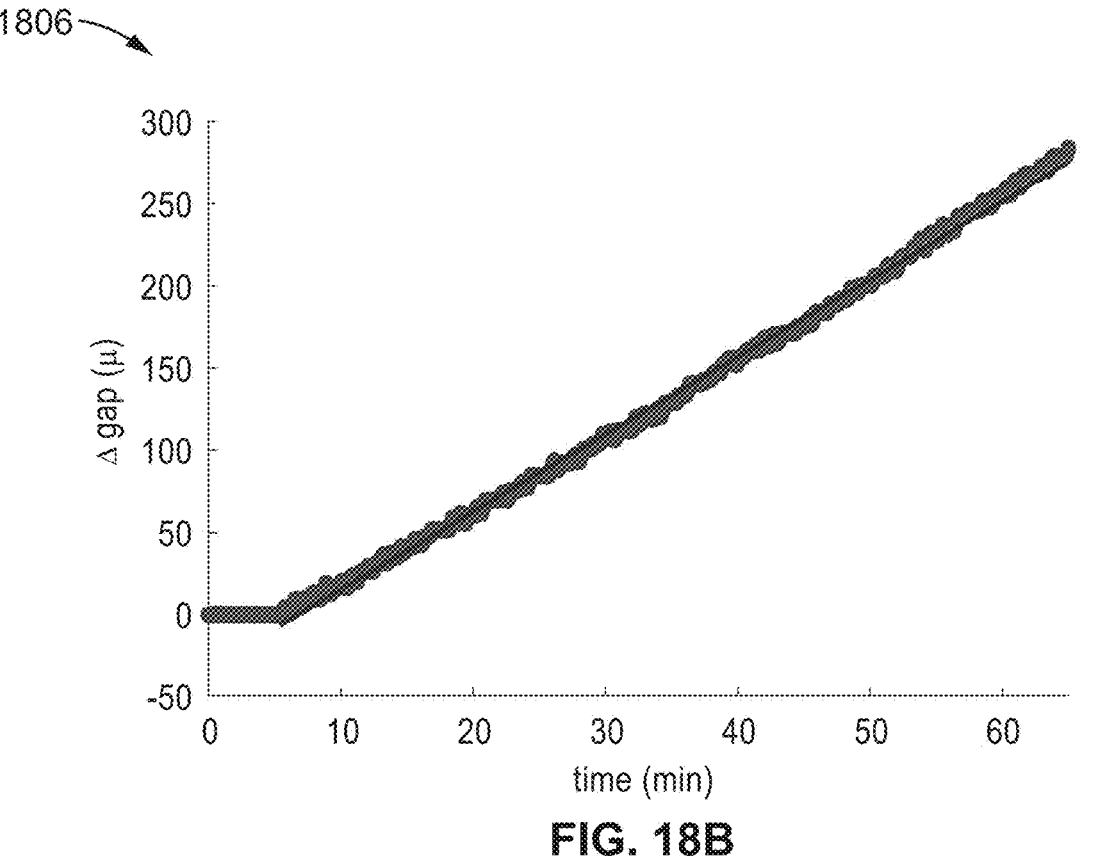
FIG. 18B is a plot of the tuning gap change $\Delta_{gap}$ in microns versus time in minutes for the same data presented in FIG. 18A.

Refer now to FIG. 18B, which is a plot 1806 of the tuning gap change $\Delta_{gap}$ in microns versus time in minutes for the same data presented in FIG. 18A. Here, two different capacitive distance sensors are shown with corresponding linear curve fits. Unfortunately for the graph, and fortunately for the experiments, all of this data and curve fitting is essentially overlapping, leading to an inability to discern the data and curve fits on the chart. The curve fits, however, result in a first gap slope of $\Delta g/\Delta t\sim0.079053$ μ/s and a second gap slope of $\Delta g/\Delta t\sim0.078746$ μ/s.

From FIG. 18A and FIG. 18B, it is seen that these tests show excellent results for persistent field control within the cryogenic stage. Essentially, it appears that the persistent flux field can be stabilized or tuned as well as one can measure the magnetic field using cryogenic hall probe technology.

At this time, experiments are proceeding with performing the magnetic field measurements using superconducting quantum interference devices (SQUIDs) that can perform much more sensitive magnetic field measurements. If we can get these fruitful, we may be able to find the ultimate limit of tuning/stabilization achievable using this technique.

A second experiment was conducted, showing both a proof-of-principle and repeatability.

Figure 19A:
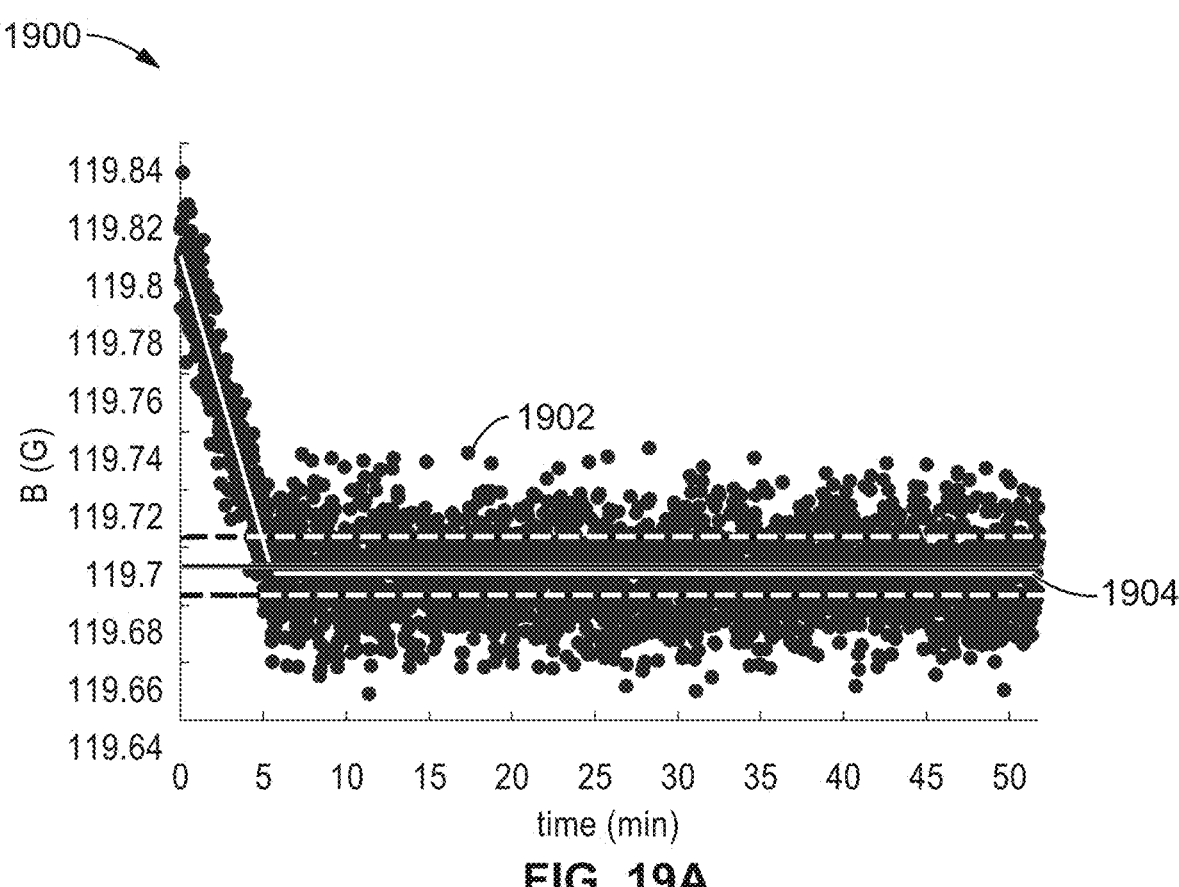
FIG. 19A is a graph of field strength versus time, where instantaneous field strengths within a magnet are measured with a cryogenic hall probe from the commercial vendor Lakeshore.

Refer now to FIG. 19A, where a graph 1900 of field strength versus time is shown. Here, instantaneous field strengths 1902 within a magnet are measured with a cryogenic hall probe from the commercial vendor Lakeshore. A moving average 1904 of these instantaneous field strength 1902 measurements is also shown. A curve fitting of this data results in a fitted decay rate resistance of $R_{fit}=9.5012\times10^{-12}\Omega$, and a fitted stability of $R_{fit}=5.5243\times10^{-15}\Omega$.

Figure 19B:
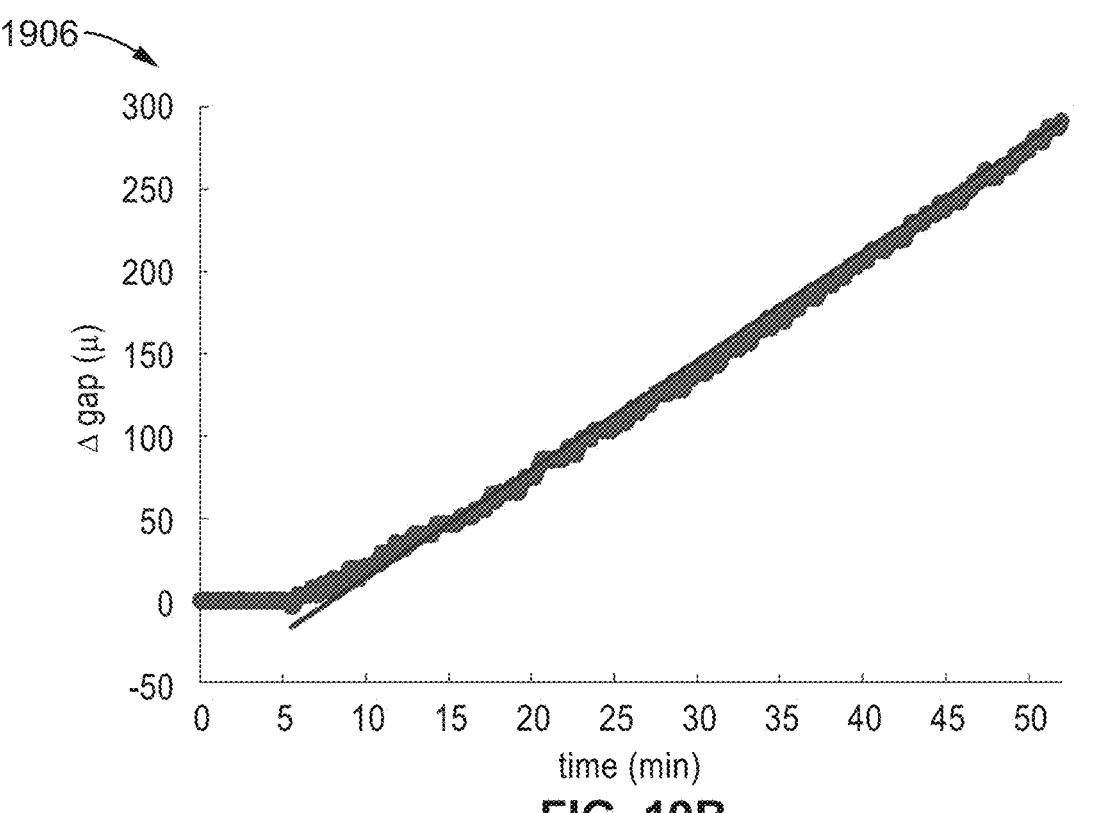
FIG. 19B is a plot of the tuning gap change $\Delta_{gap}$ in microns versus time in minutes for the same data presented in FIG. 19A.

Refer now to FIG. 19B, which is a plot 1906 of the tuning gap change $\Delta_{gap}$ in microns versus time in minutes for the same data presented in FIG. 19A. Here, two different capacitive distance measurement devices are shown with their corresponding linear curve fits. Repeating the graph overlaps found in FIG. 18B, all of this data and curve fitting is essentially overlapping, leading to an inability to discern the data and curve fits on the chart. The curve fits, however, result in a first gap slope of $\Delta g/\Delta t\sim0.11009$ μ/s and a second gap slope of $\Delta g/\Delta t\sim0.11022$ μ/s.

From FIG. 19A and FIG. 19B, it is seen that these tests show excellent results for persistent field control within the cryogenic stage.

Up until this point, a gap change has been used to change inductance for persistent flux control. In this scenario, inductance is a function of gap L(gap), as previously presented in FIG. 5.

Figure 20:
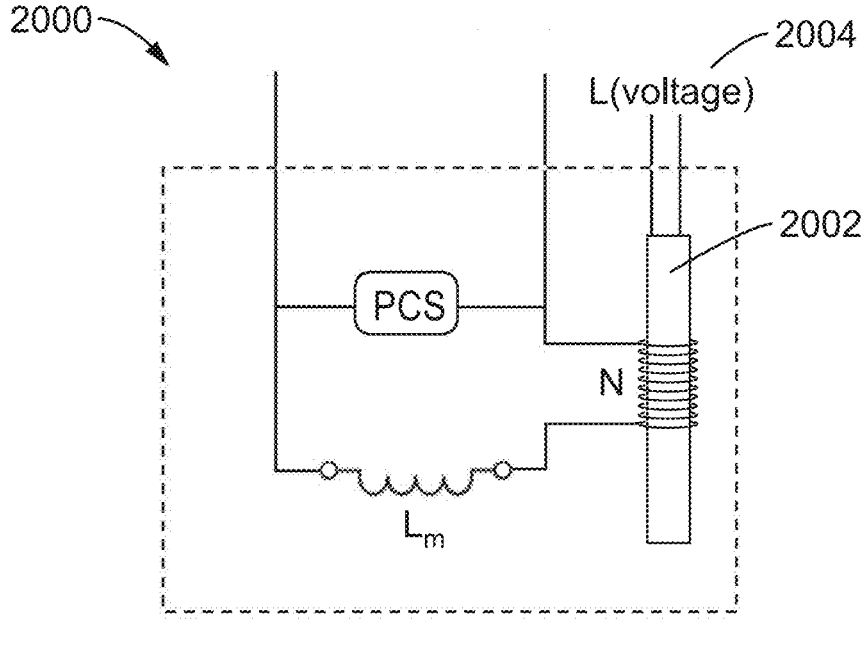
FIG. 20 is a schematic of voltage tunable inductor, whereby an applied voltage produces a strain, that leads to a permeability change, which leads to an inductance change.

Refer now to FIG. 20, which is a schematic 2000 of voltage tunable inductor 2002, whereby an applied voltage 2004 produces a strain, that leads to a permeability change, which leads to an inductance change. In this implementation, inductance is a function of voltage, L(voltage), where a piezoelectric device applies strain at the interface of a magnetostrictive material. With the correct material choices, this causes massive changes in permeability of the inductor by changing the magnetic anisotropic properties of the inductor.

FIG. 21A through FIG. 21D are from T. Yan, L. Geng, L. Zhang, and et al., "Correlation between tunability and anisotropy in magnetoelectric voltage tunable inductor (VTI)," Sci Rep, vol. 7, p. 16008, 2017, with minor modifications, under a Creative Commons Attribution 4.0 International License, see https://creativecommons.org/licenses/by/4.0/.

Figure 21A:
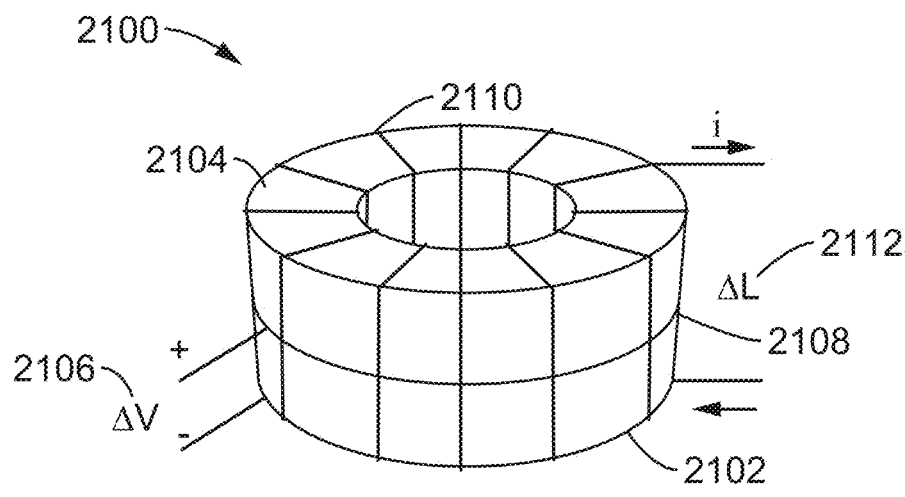
FIG. 21A is a prior art voltage tunable inductor (VTI) created by two toroids, one piezoelectric and one magnetostrictive, which are joined together.

Refer now to FIG. 21A, where a prior art voltage tunable inductor (VTI) 2100 is created by two toroids, one piezoelectric 2102 and one magnetostrictive 2104 are joined together. A tuning voltage 2106 is applied to the piezoelectric 2102 toroid, which in turn applies a strain to the interface 2108 coupling the piezoelectric 2102 and magnetostrictive 2104 together. When a coil 2110 is wrapped around the piezoelectric 2102 and magnetostrictive 2104 toroids, a change in inductance $\Delta L$ 2112 may be observed.

Figure 21B:
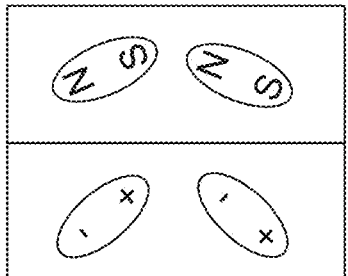
FIG. 21B is a prior art inverse piezoelectric effect, where a difference in applied voltage $\Delta V$ changes the applied electric field E, which in turn produces a strain $\varepsilon$.

Refer now to FIG. 21B, which shows a prior art inverse piezoelectric effect, where a difference in applied voltage $\Delta V$ changes the applied electric field E, which in turn produces a strain ε.

Figure 21C:
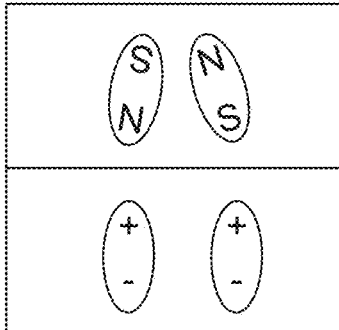
FIG. 21C is a prior art chart that shows that the strain produces a change in the magnetic susceptibility $\Delta M$, in turn giving rise to a change in permeability $\Delta\mu$ and therefore, inductance $\Delta L$.

Refer now to FIG. 21C, which is a prior art chart that shows that the strain produces a change in the magnetic susceptibility $\Delta M$, in turn giving rise to a change in permeability $\Delta \mu$ and therefore, inductance $\Delta L$.

When FIG. 21B and FIG. 21C are combined, it is seen that the application of a voltage change ultimately produces a change in inductance.

Figure 21D:
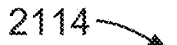
FIG. 21D is a prior art chart of inductance tunability $\gamma$ versus magnetic anisotropy $K_0$.
Figure 21D:
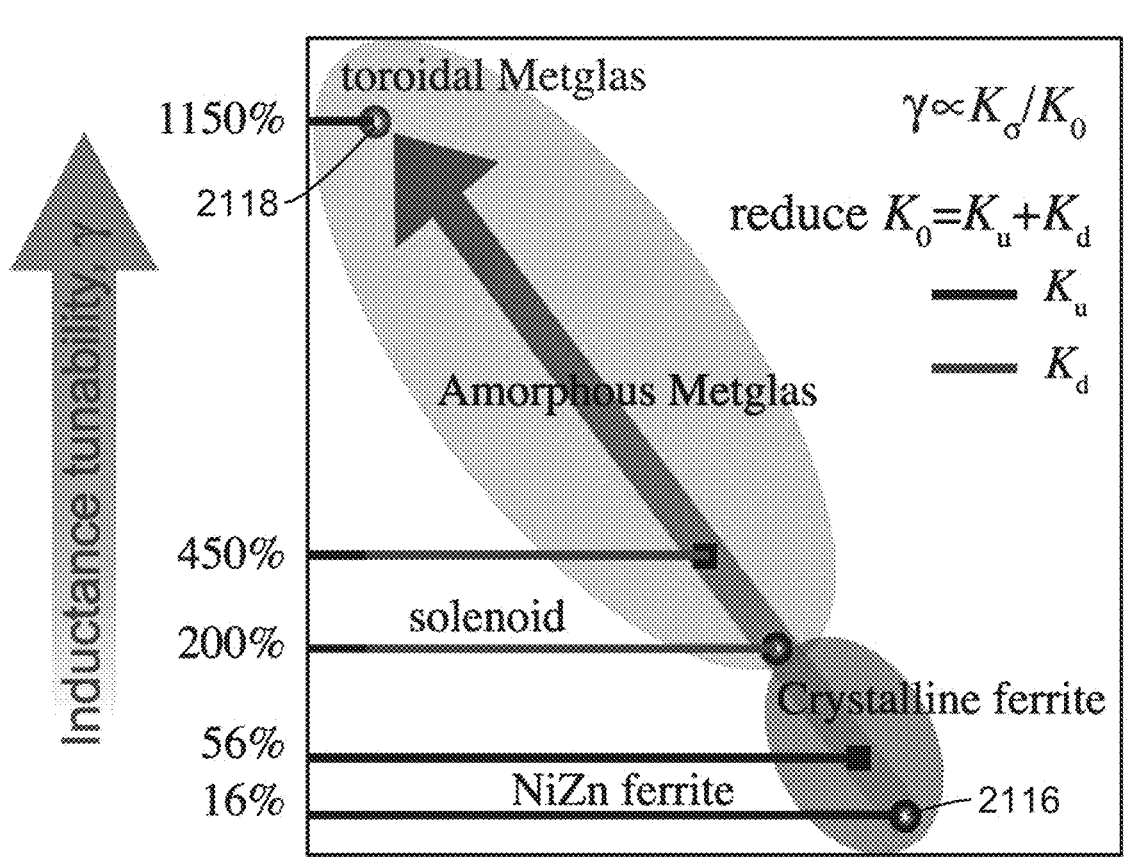

Refer now to FIG. 21D, which is a prior art chart 2114 of inductance tunability $\gamma$ versus magnetic anisotropy $K_0$. Here, inductance tunability ranges from a low of 16% with a NiZn ferrite material 2116 up to a high of 1150% with a toroidal Metglas 2118 voltage tunable inductor. This chart 2114 indicates that a change of inductance of over 1000% may be achieved.

Figure 21E:
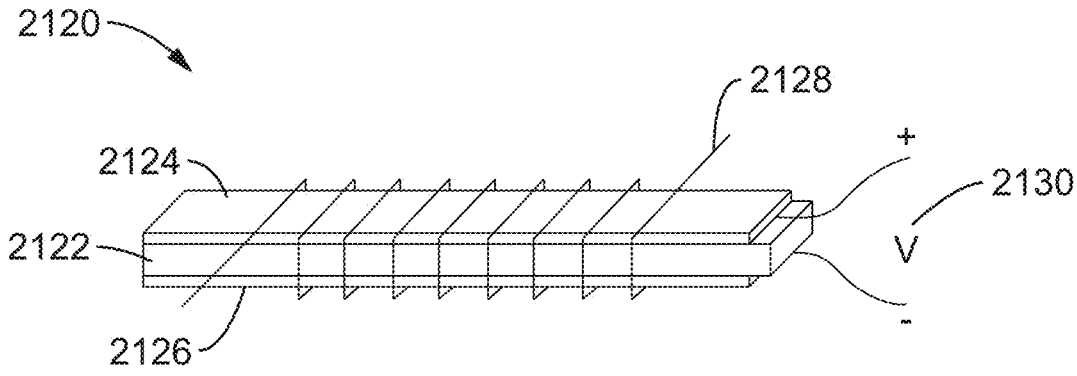
FIG. 21E is a depiction of a magnetoelectric inductor with a multiferroic composite core.

Refer now to FIG. 21E, which is a depiction 2120 of a magnetoelectric inductor with a multiferroic composite core. Here, a piezoelectric (PZT) slab 2122 has attached to it a top 2124 and bottom 2126 of Metglas 2605CO. Around the sandwich of PZT 2122 and Metglas 2124 and 2126 is wound a working coil 2128 from which an inductance is obtained. Finally, a control voltage 2130 is applied to the top and bottom of the PZT slab 2122 to control the inductance obtained by the working coil 2128.

Figure 22A:
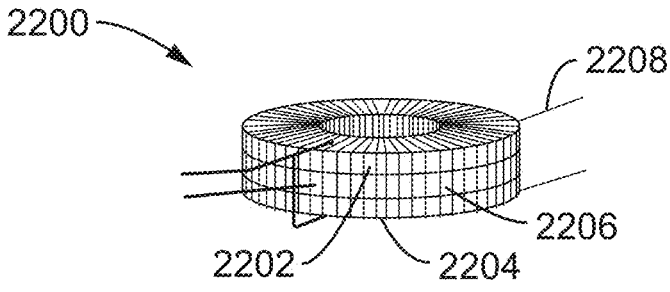
FIG. 22A is a three-dimensional view of a PZT/ferrite/ PZT laminated ring somewhat similar to the toroidal voltage tunable inductor previously shown in FIG. 21A.
Figure 22B:
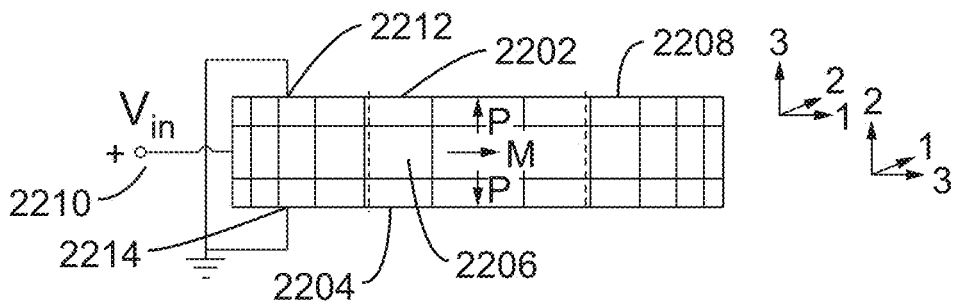
FIG. 22B is a side view of the toroidal laminated ring of FIG. 22A, showing that a PZT input voltage is applied to the Metglas ferrite center, and that the top PZT and bottom PZT are grounded respectively at two connection points.

Refer now to FIG. 22A and FIG. 22B. FIG. 22A is a three-dimensional view of a PZT/ferrite/PZT laminated ring 2200 somewhat similar to the toroidal voltage tunable inductor previously shown in FIG. 21A. Here, a top PZT toroid 2202 and a bottom PZT toroid 2204 is laminated to a ferrite core 2206, and a coil 2208 wound about the resultant PZT/ferrite/PZT laminated ring 2200.

FIG. 22B is a side view of the toroidal laminated ring 2200 of FIG. 22A, showing that a PZT input voltage 2210 is applied to the Metglas 2206 ferrite center, and that the top PZT 2202 and bottom PZT 2204 are grounded respectively at connection points 2212 and 2214. This figure illustrates the direction of the ferrite ring's easy magnetization axis, the piezoelectric PZT rings' polarization, and the electric field applied to the piezoelectric top 2202 and bottom 2204.

The flux tuner described above could be implemented in either of the two ways discussed, each with its own advantages and disadvantages. Additional techniques could be used, that include in principle any action that changes the inductance of the circuit. These additional techniques could include: moving of ferromagnetic material; permeability change through magnetostriction, temperature or other means; moving of superconducting material; or change in superconducting properties.

The C-shaped moveable yoke was initially chosen due to its simple geometry and ease of modelling. Other geometries could be used as well with an increase in analytical and fabricational difficulty. The C-shaped moveable yoke that creates a movement-based inductance change has three principal advantages: 1) when in the off state, there is no motion in the moveable yoke; 2) very fine tunability and stability has already been demonstrated, and 3) proof-of-principle has been successfully demonstrate in the laboratory. The disadvantages of the C-shaped moveable yoke design include: 1) it's an expensive device and controller; 2) a reduced relative inductance change is limited to ~50%; 3) high frequency operation has not been demonstrated; and 4) applied force limitations make designs for high current applications difficult. Additional future options include moving the stage or rotator outside of the cryostat, or using a lead screw actuation approach.

On the other hand, the voltage tunable inductor (VTI) design has its own set of advantages and disadvantages. VTI advantages include: 1) larger force limits, which is better for large currents; 2) potentially an extremely low-cost device; 3) a larger relative inductance change exceeding 1000%; and 4) it could work at relatively higher frequencies (since nothing is moving) which could be advantageous for active noise compensation. VTI disadvantages include: 1) the properties of the magnetostrictive materials are not well known or characterized at cryogenic temperatures; 2) the piezoelectric/magnetostrictive interface presently uses a glued interface, which may present reliability issues; 3) the ability to fine tune has not been reported in the literature; 4) the stability of VTI devices has not been reported in the literature; 5) a significant research and development effort would be needed to demonstrate VTI feasibility and performance; and 6) in the "off" state, an applied voltage would still need to be applied, which could introduce ripple or other applied voltage effects.

13. 4.5° K Transmission Electron Microscopy Test Results Using Persistent Current Control Recent laboratory testing in a cryostat at 4.5° K has shown excellent results for the control of persistent currents in a transmission electron microscopy (TEM) application.

Figure 23:
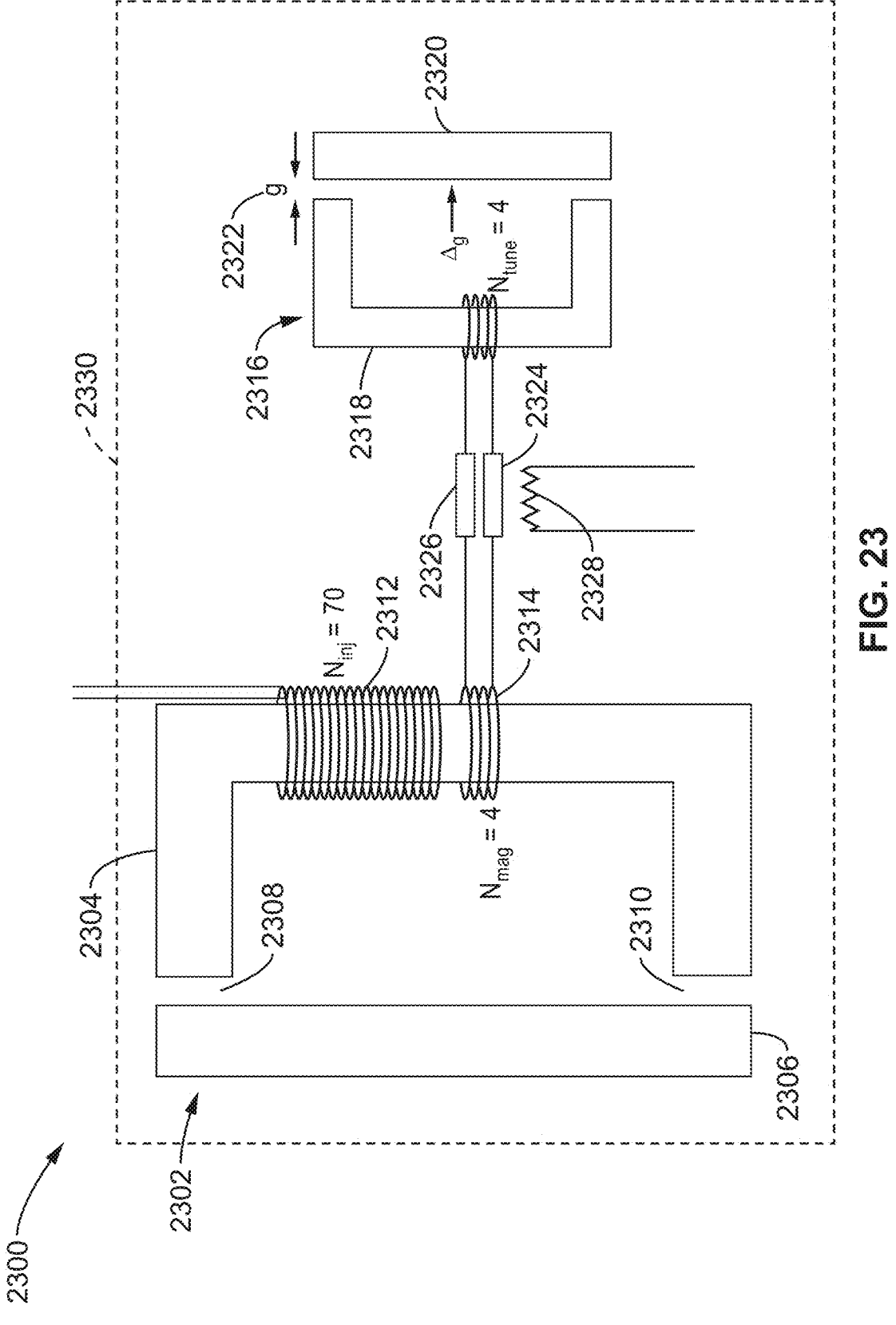
FIG. 23 is an experimental schematic of a main superconducting magnet operating in a persistent magnetic operation mode that is stabilized by use of a variable inductor.

Refer now to FIG. 23, which is an experimental schematic 2300 of a main superconducting magnet 2302 operating in a persistent magnetic operation mode that is stabilized by use of a variable inductor. Here, the main magnet 2302 comprises a C-shaped main section 2304, and a flat bar return yoke 2306. In the gaps between the C-shaped main section 2304 and a flat bar return yoke 2306 are a cryogenic Hall probe 2308, and a graphene probe 2310. The main magnet 2302 is energized by an initial current provided by injection coil 2312, which in this example has $N_{inj}$=70 turns wrapping about the C-shaped main section 2304.

During operation, the C-shaped main section 2304 will tend to lose flux due to various superconducting phenomena. Such losses may be corrected by the correction coil 2314 with $N_{ma}$=4 turns that couple to a variable inductor 2316 with a C-shaped section 2318 and a movable yoke 2320 that allows for a change in gap 2322 therebetween. One or more superconducting joints 2324, 2326 allow for connection between the main superconducting magnet 2302 and the variable inductor 2316. In particular heat 2328 may be applied to one of these joints to allow for quenching of the persistent flux of both the main superconducting magnet 2302 and the variable inductor 2316. In this instance, the heat 2328 source is shown as a resistive heating element adjacent to superconducting joint 2324.

Figure 24:
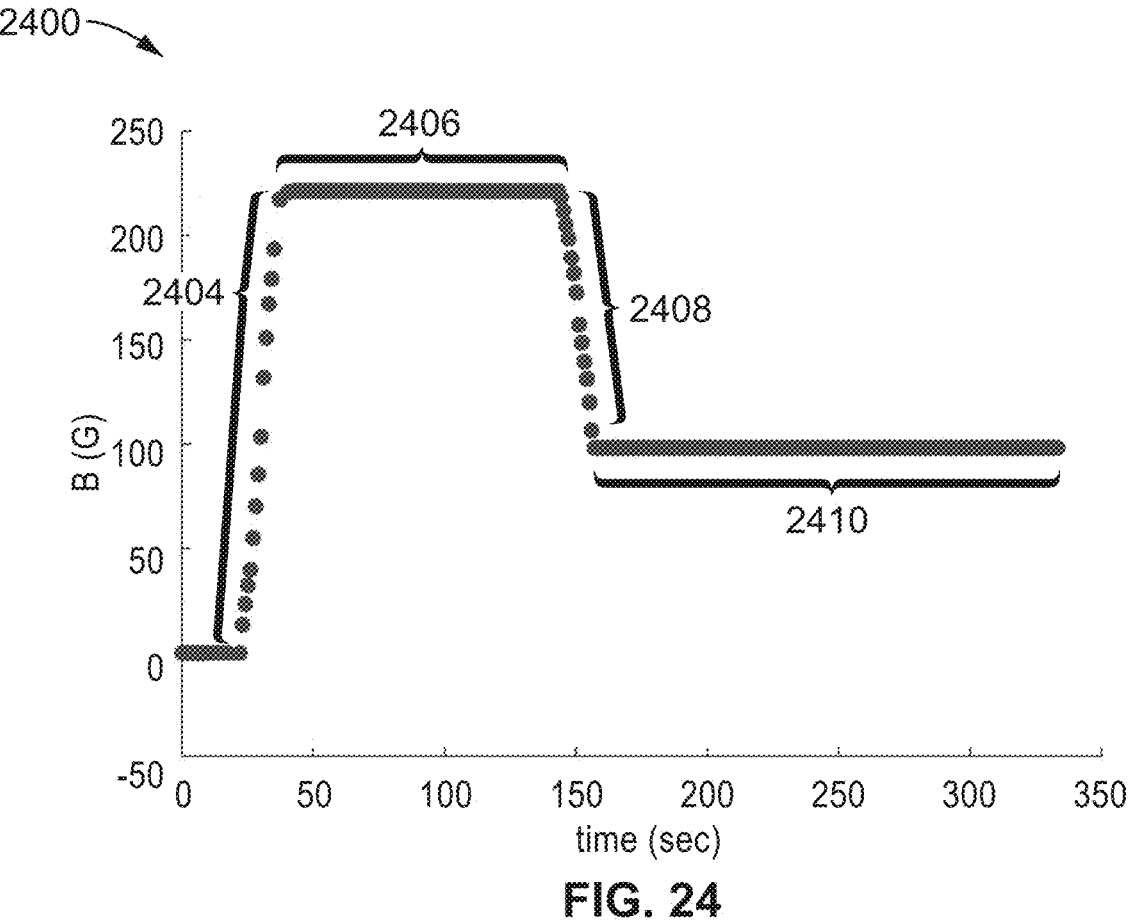
FIG. 24 is a graph of field strength of the main superconducting magnet of FIG. 23, versus time.

Refer now to FIG. 23 and FIG. 24. FIG. 24 is a 2400 graph of field strength of the main superconducting magnet 2302 discussed above, versus time. Initially, there is no field present 2402, as the heat 2328 source is on in the cryostat 2330, quenching the circuit by raising at least a portion of the cryostat above superconducting conditions. At about 20 seconds on the graph 2400, the injection coil 2312 is energized, creating an increasing magnetic field 2404. At about 50 seconds, the heat 2328 source is turned off, allowing the superconducting circuit to recover from the quench. At about 150 seconds, the injection coil 2312 is ramped down 2408 to an "OFF" state. After the injection coil 2312 is down to zero current, all that remains is the field 2410 produced by the persistent current of the main superconducting magnet 2302.

Figures 25A, 25B:
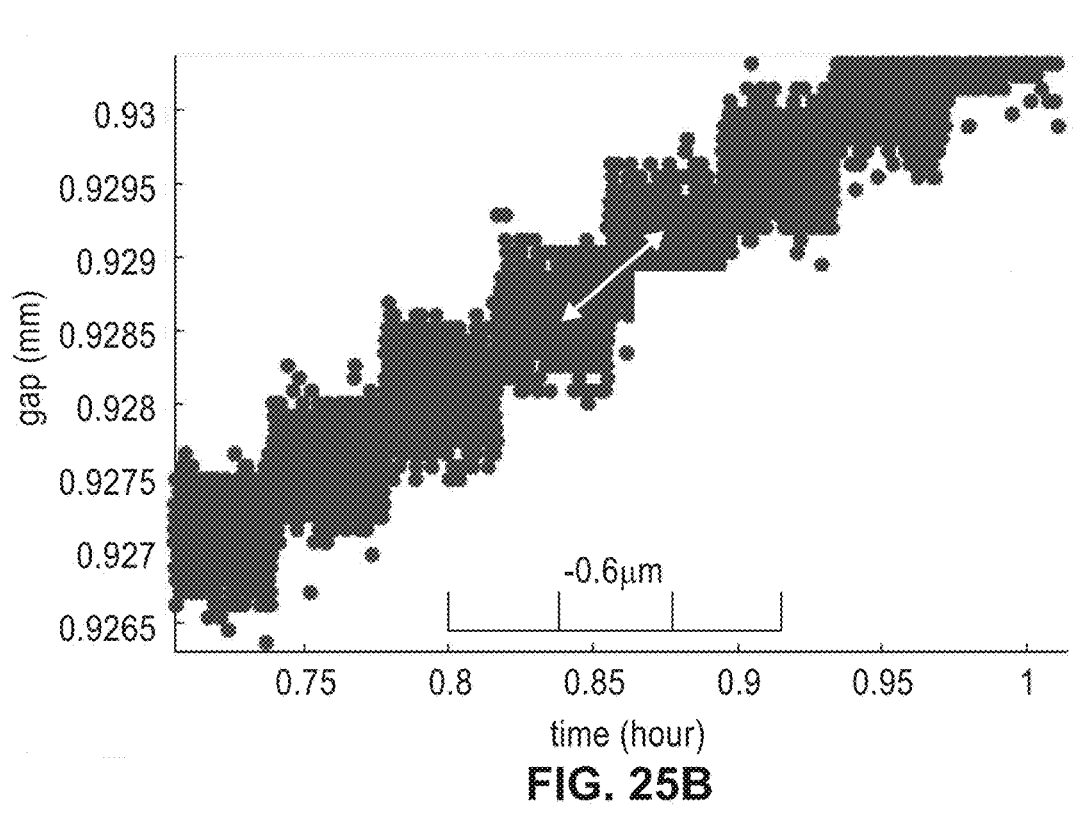
FIG. 25A is a graph of the variable inductor gap of FIG. 23 versus time.
FIG. 25B is an enlarged portion of the graph of FIG. 25A showing the distinct movements of the gap corresponding to steps of ~0.6 μm.

Refer now to FIG. 25A and FIG. 25B. FIG. 25A is a graph of the variable inductor 2316 gap 2322 of FIG. 23 versus time. This gap 2322 was measured with a cryogenic capacitive distance measurement device over a range from about 0.917-0.965 mm over a time of about 3.7 hours.

FIG. 25B is an enlarged portion of the graph of FIG. 25A showing the distinct movements of the gap corresponding to steps of ~0.6 μm. These steps correspond to the minimum step size allowable to the variable inductor 2316.

Figure 26A:
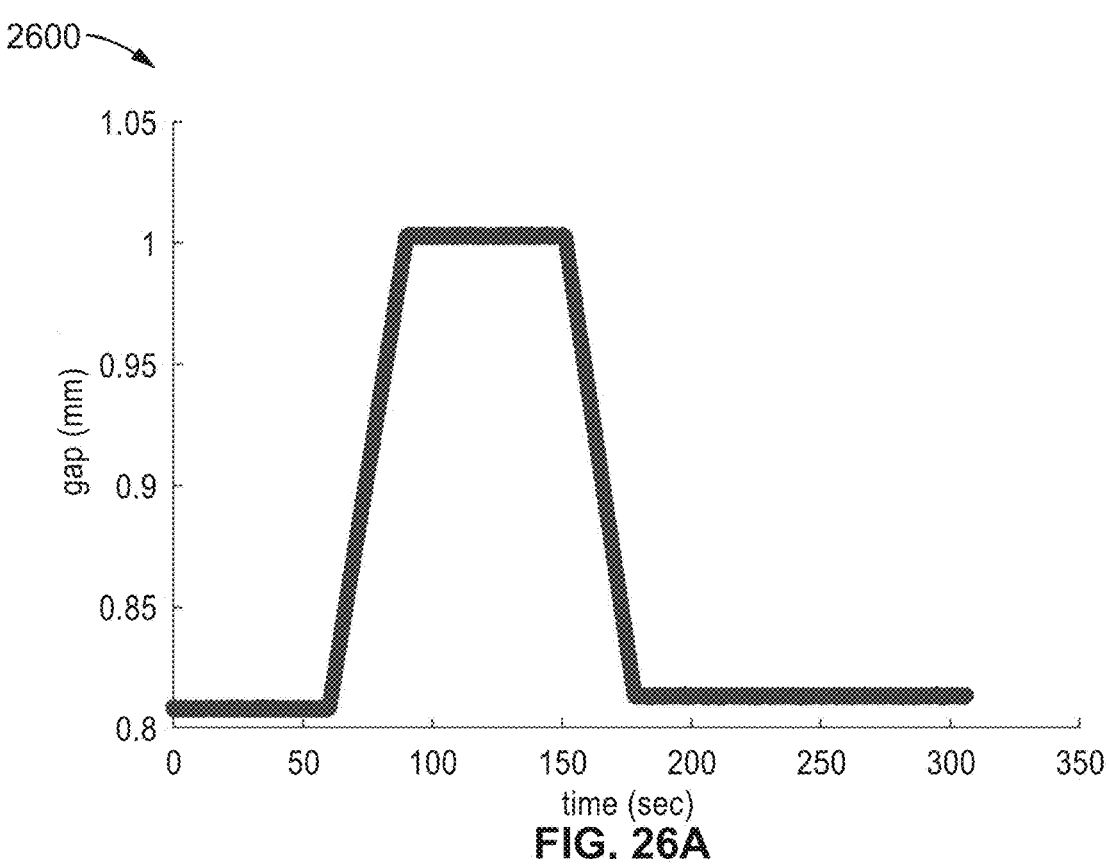
FIG. 26A shows a graph of the gap (of FIG. 23) versus time through a stair-step movement of the movable yoke. This corresponds to a change in measured field strength, and shows a change of field strength commensurate with the change in gap, i.e., the graphs look basically the same.
Figure 26B:
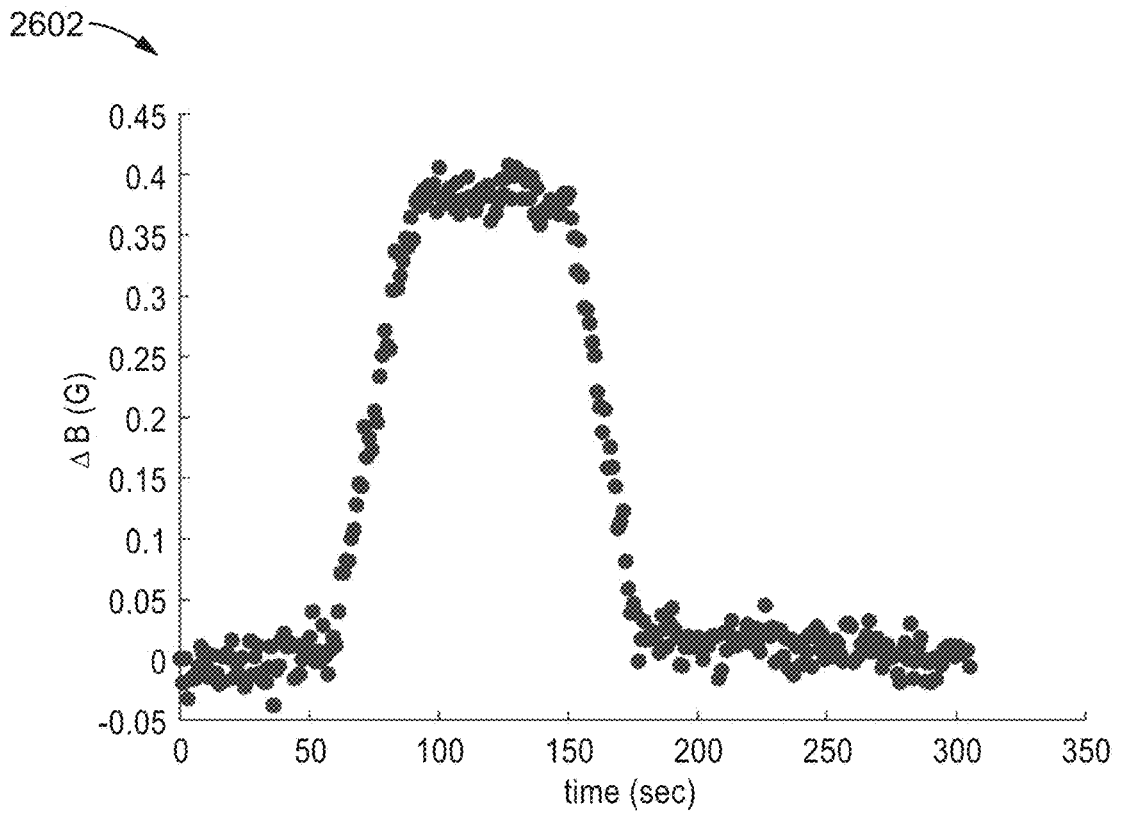
FIG. 26B is a graph of the field strength corresponding to the changes of FIG. 26A, where the data corresponds to a change in measured field strength, and shows a change of field strength commensurate with the change in gap, i.e., the graph looks basically the same as that of FIG. 26A.

Refer now to FIG. 26A and FIG. 26B. FIG. 26A shows a graph 2600 of gap 2322 (of FIG. 23) versus time through a stair-step movement of the movable yoke 2320. In FIG. 26B, the field strength corresponding to the changes of FIG. 26A are shown. This corresponds to a change in measured field strength, and shows a change of field strength commensurate with the change in gap 2322, i.e. the graphs look basically the same.

Figure 27A:
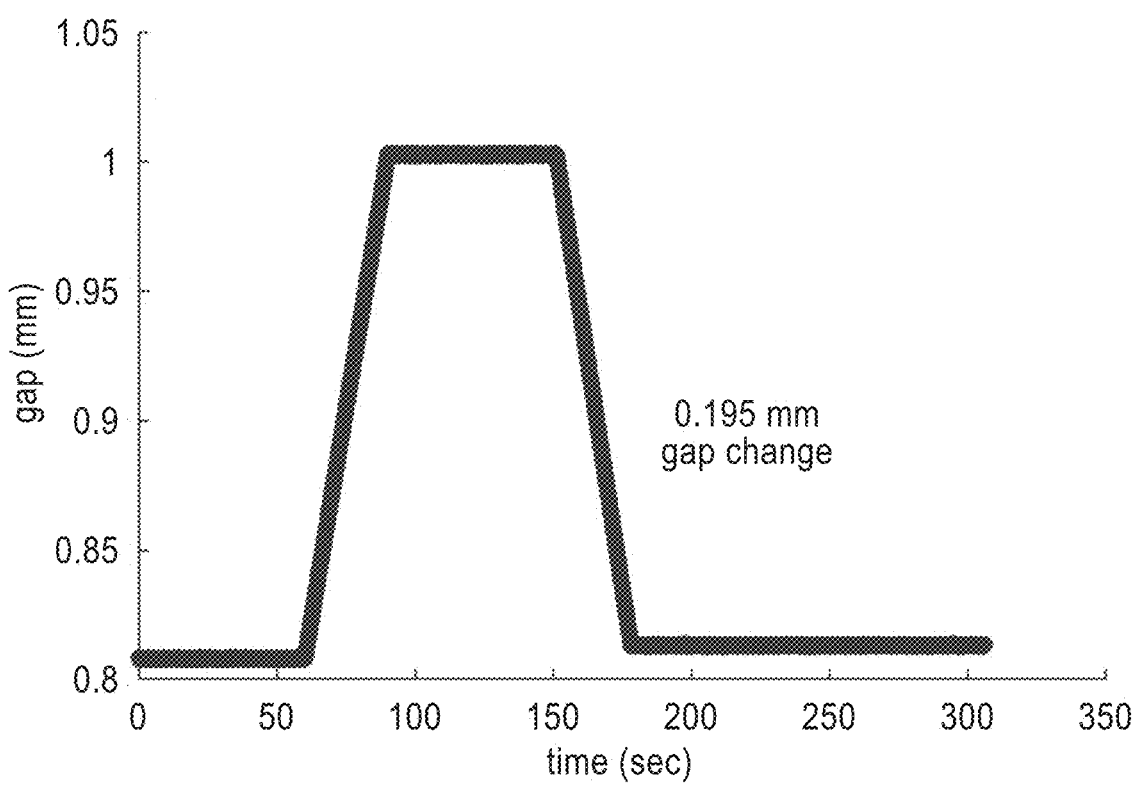
FIG. 27A is a graph of stair step movements of the movable yoke gap versus time, similar to the previous FIG. 26A, but with a 0.195 mm gap change.
Figure 27B:
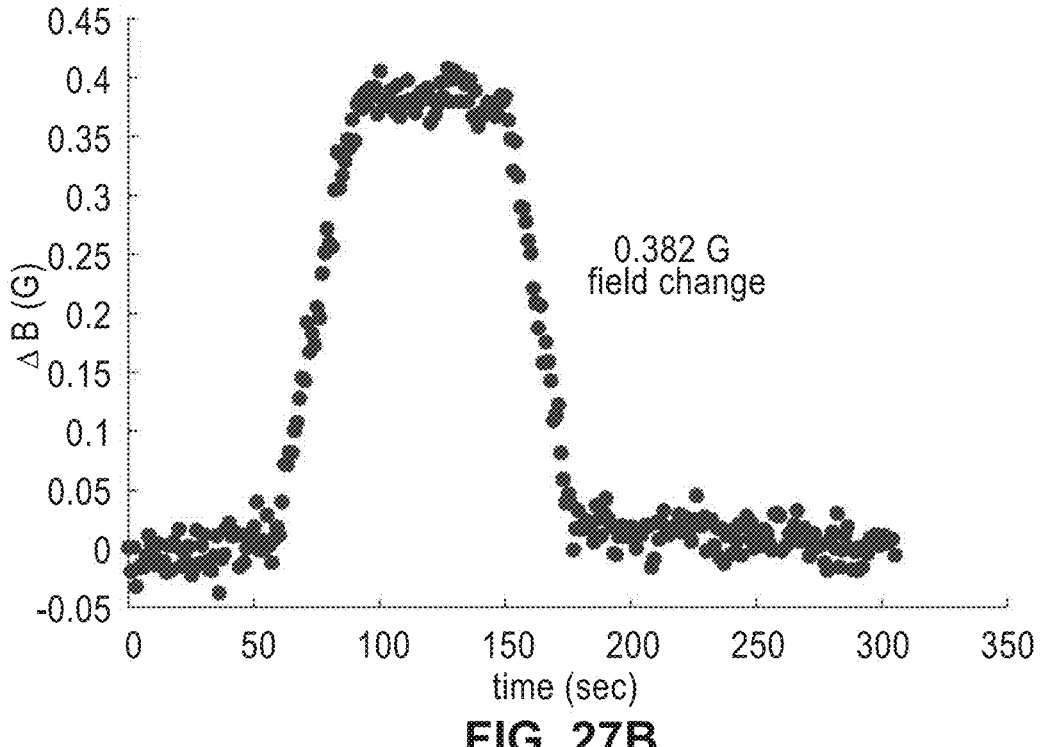
FIG. 27B is a graph of the field strength corresponding to the changes of FIG. 27A, where the data corresponds to a change in measured field strength, and shows a change of field strength commensurate with the change in gap, i.e., the graph looks basically the same as that of FIG. 27A, showing a 0.382 Gauss field change.
Figure 28A:
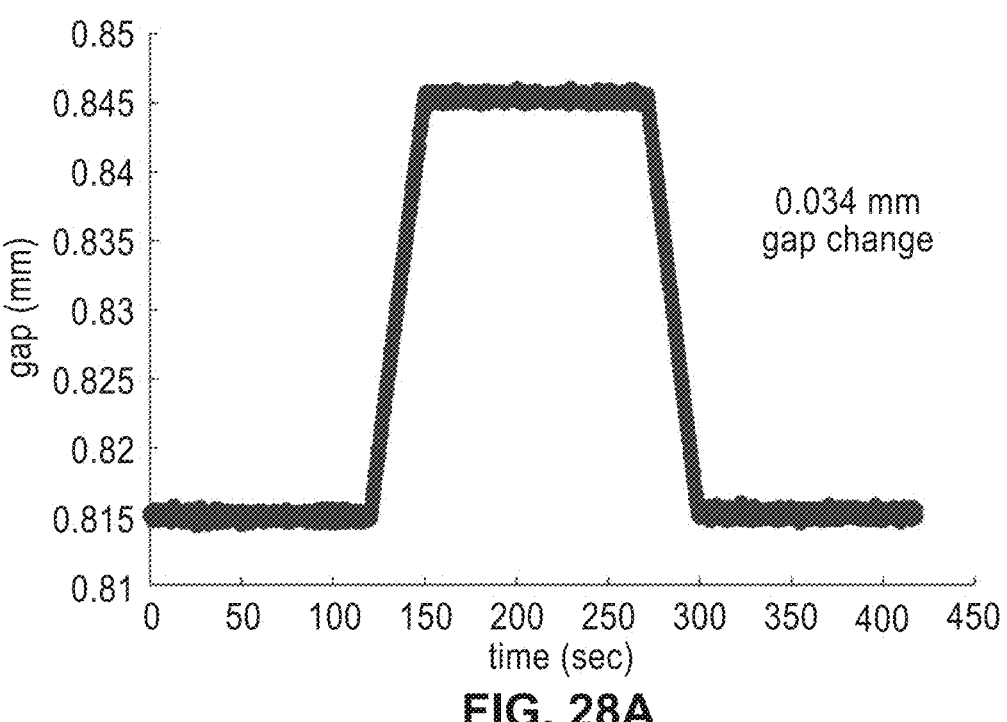
FIG. 28A is a graph of stair step movements of the movable yoke gap versus time, similar to the previous FIG. 26A, but with a 0.034 mm gap change.
Figure 28B:
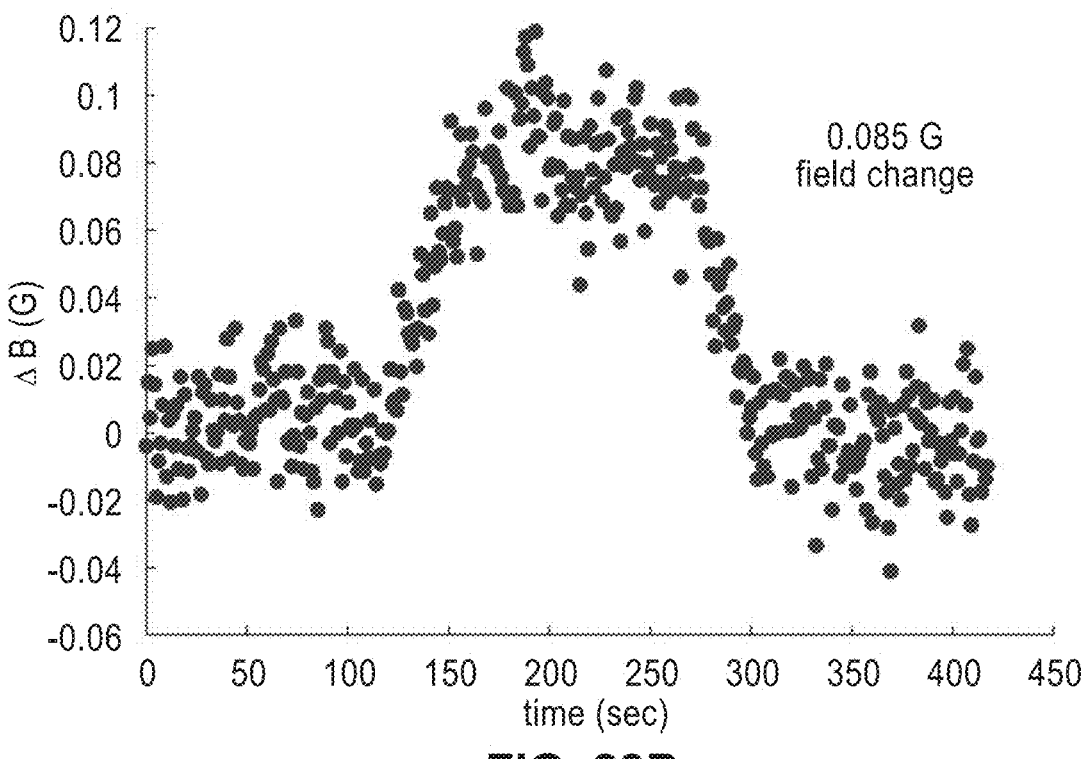
FIG. 28B is a graph of the field strength corresponding to the changes of FIG. 28A, where the data corresponds to a change in measured field strength, and shows a change of field strength commensurate with the change in gap, i.e., the graphs look basically the same as that of FIG. 28A, showing a noisy 0.085 Gauss field change.
Figure 29A:
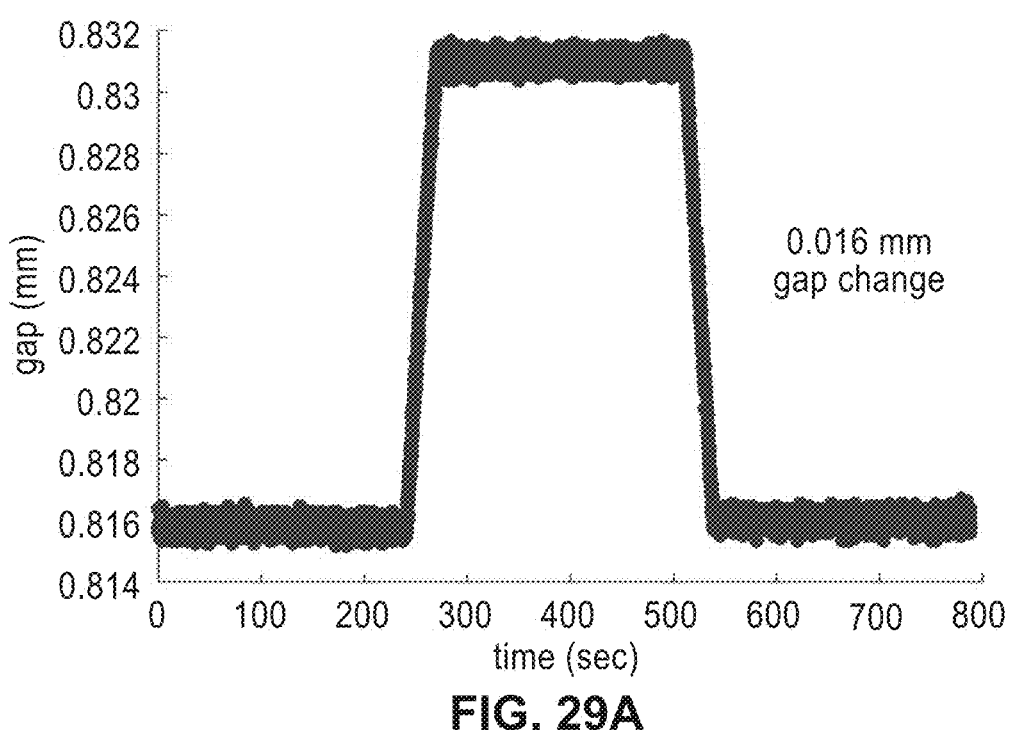
FIG. 29A is a graph of stair step movements of the movable yoke gap versus time, similar to the previous FIG. 26A, but with a 0.016 mm gap change.
Figure 29B:
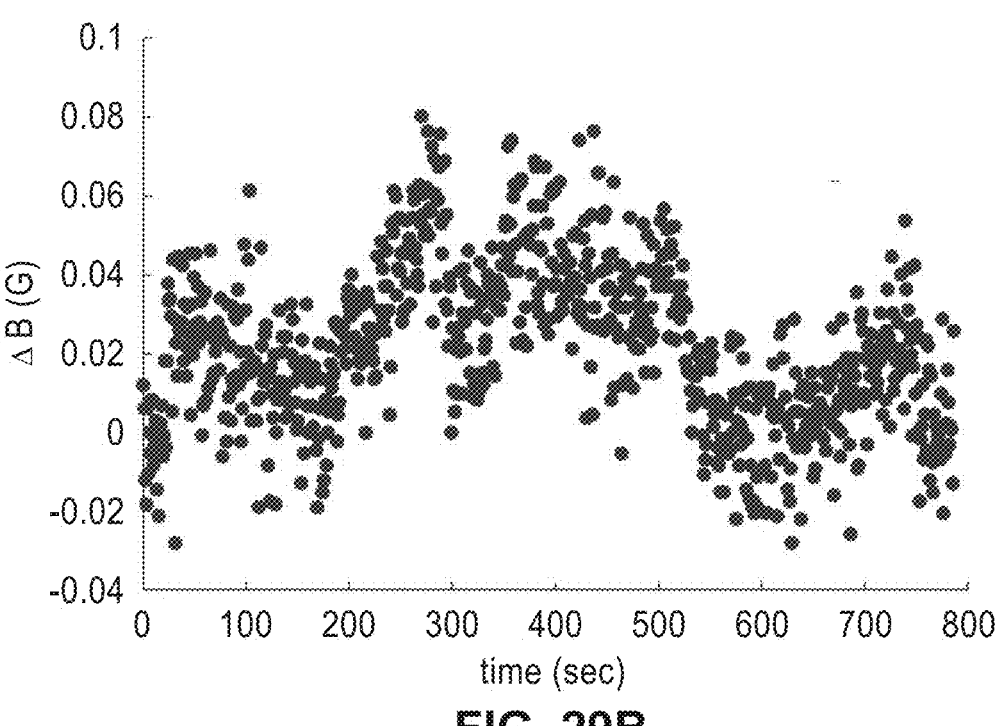
FIG. 29B is a graph of the field strength corresponding to the changes of FIG. 28A, where the data corresponds to a change in measured field strength, and shows a change of field strength commensurate with the change in gap, i.e., the graph looks basically the same as that of FIG. 29A, showing a possible 0.04 Gauss field change.

Refer now to FIG. 27A, FIG. 27B, FIG. 28A, FIG. 28B, FIG. 29A, and FIG. 29B. FIG. 27A, FIG. 28A, and FIG. 29A are stair step movements of the movable yoke 2320 gap 2322 versus time, similar to previous FIG. 26A, but with 0.195 mm, 0.034 mm, and 0.016 mm gap change, respectively. Each of these plots correspond to field measurements in FIG. 27B, FIG. 28B, and FIG. 29B. It is apparent that the gap 2322 movements correspond to a 0.382 Gauss field change in FIG. 27B, a noisy 0.085 Gauss field change in FIG. 28B, and perhaps a 0.04 Gauss field change in the very noisy FIG. 29B.

Figure 30:
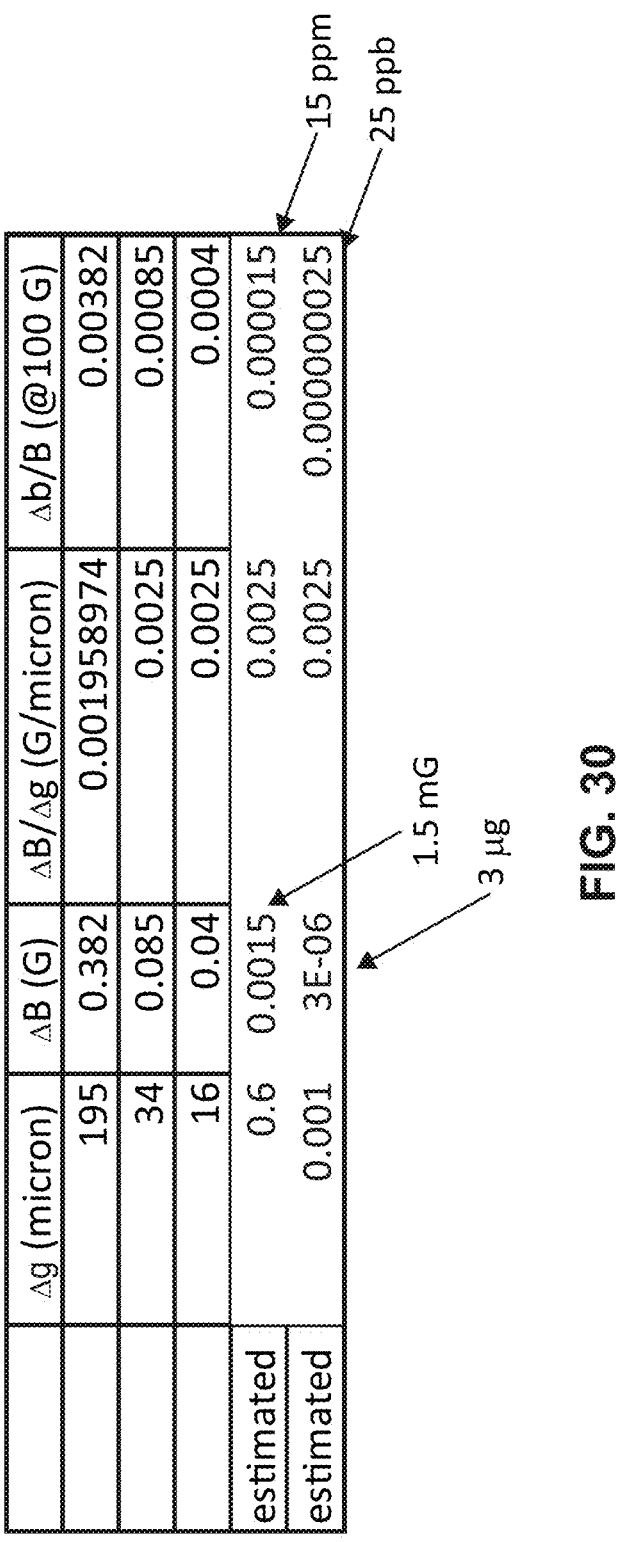
FIG. 30 is a table of changes in gap with corresponding changes in field strength used to extrapolate the tuning limit of the device tested above in FIG. 23, where it appears that $\Delta B/B$ approaches 15 ppm, and could even approach 25 parts per billion.

Refer now to FIG. 30, which is a table of changes in gap with corresponding changes in field strength to extrapolate the tuning limit of the device tested above in FIG. 23. Here, it appears that ΔB/B approaches 15 ppm, and could even approach 25 parts per billion.

Figure 31A:
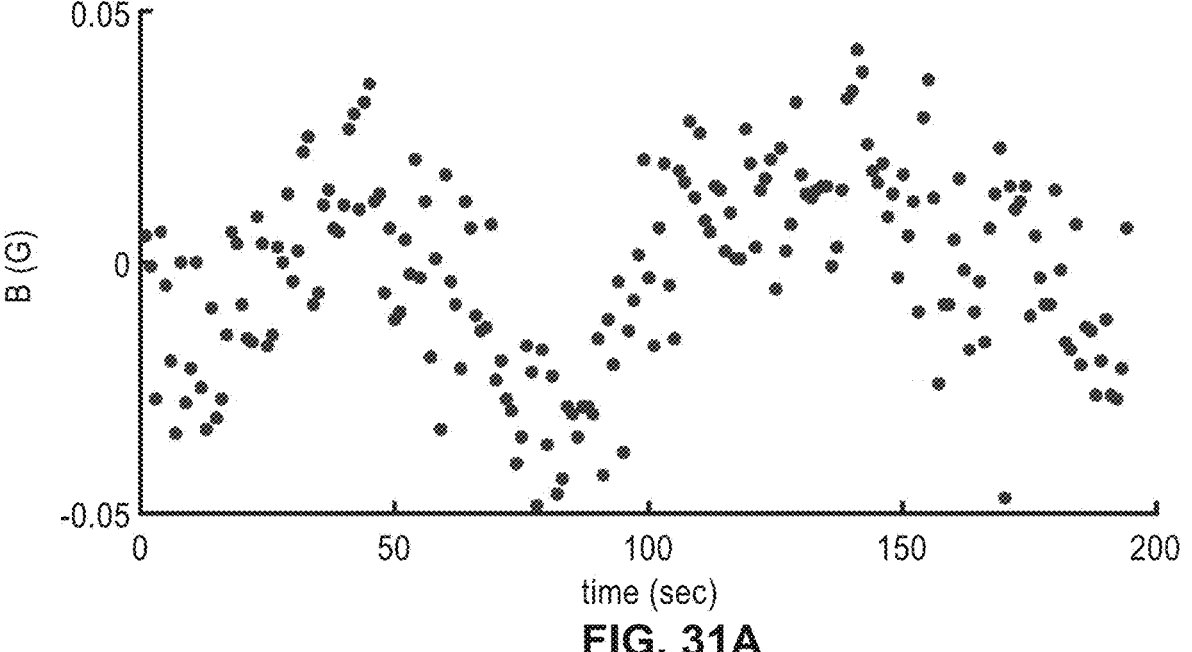
FIG. 31A is a measurement of field strength versus time of Hall probe noise in a calm cryostat (allowed to come to equilibrium overnight), immersed in liquid Helium (to a depth of ~18 inches).
Figure 31B:
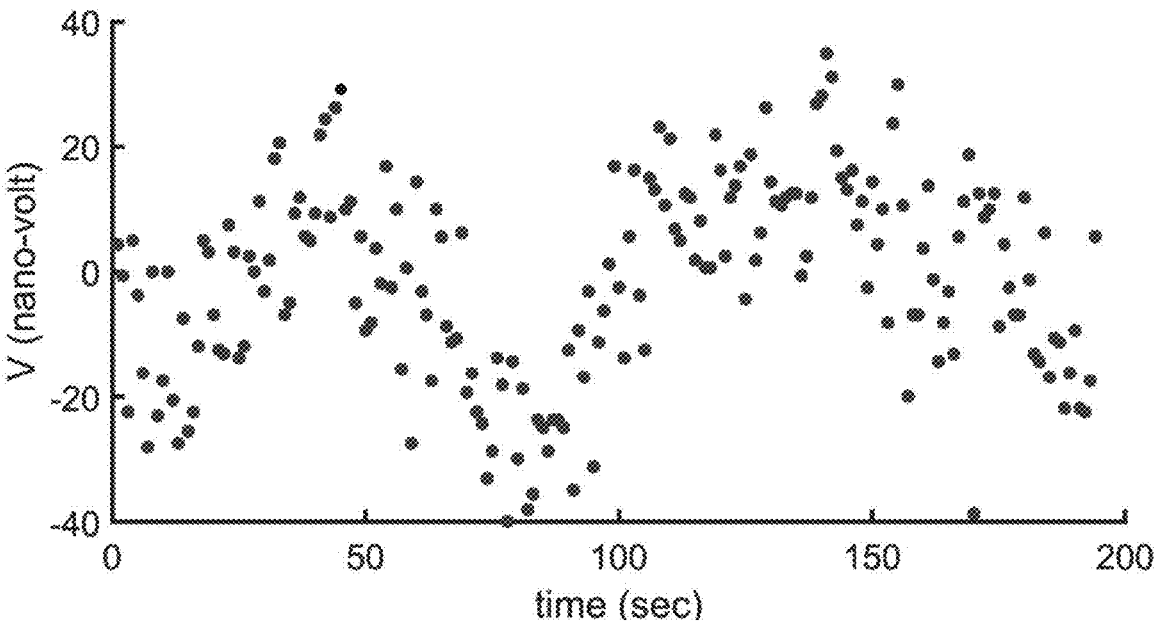
FIG. 31B is a graph of the measured voltage of FIG. 31A, which has a standard deviation of 15.9568 nV.

Refer now to FIGS. 31A and 31B. FIG. 31A is a measurement of field strength versus time of Hall probe noise in a calm cryostat (allowed to come to equilibrium overnight), immersed in liquid Helium (to a depth of ~18 inches), with probes in operation for over 12 hours, and using a Lakeshore 120 current source. In FIG. 31A, the standard deviation is 0.019365 Gauss. In FIG. 31B, the measured voltage has a standard deviation of 15.9568 nV.

Figure 32A:
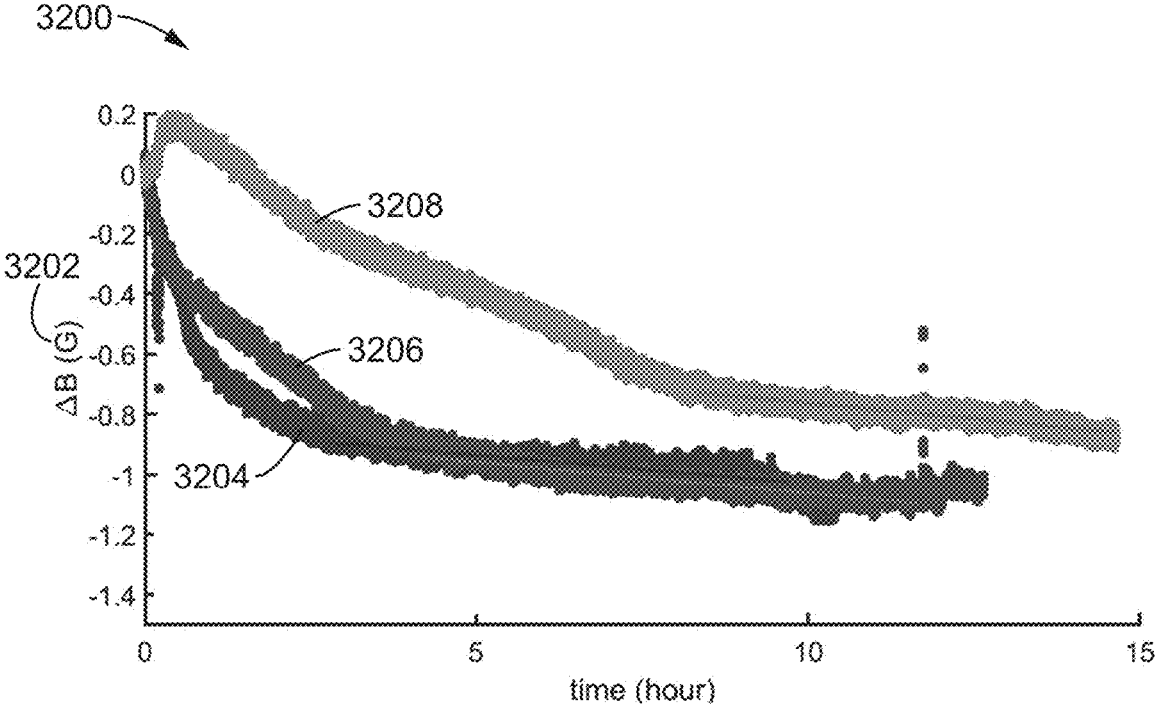
FIG. 32A is a graph of $\Delta B$ in Gauss versus time of Hall probe noise in a calm cryostat in an experimental run with 10.5 A and a helium level of 27 inches, resulting in a standard deviation is 0.019365 Gauss.
Figure 32B:
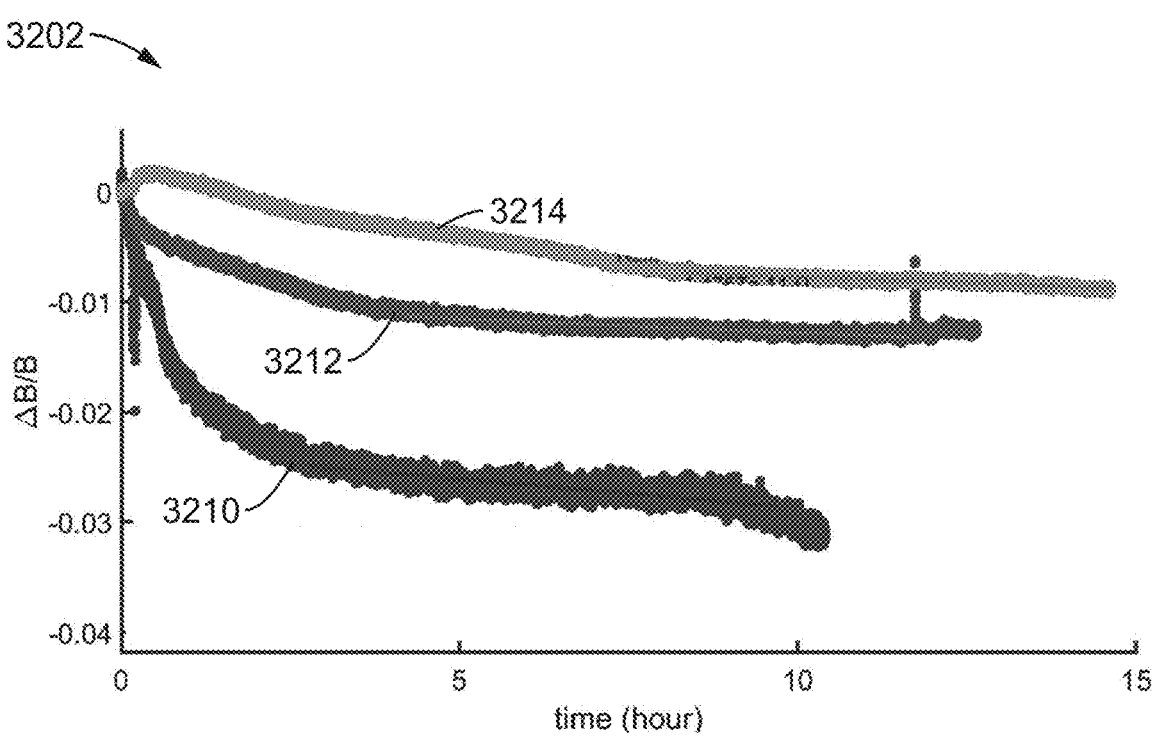
FIG. 32B is a graph of measured voltage versus time of FIG. 32A, resulting in a measured voltage a standard deviation of 15.9568 nV.

Refer now to FIG. 32A and FIG. 32B. These figures show ΔB in Gauss versus time 3200, and ΔB/B 3202 respectively for three runs with different currents and different levels of helium in the cryostat: run one 3204 was with 10.5 A with a helium level of 27 inches; run two 3206 was 24.3 A with a helium level of 24.3 A, and finally run 3 3208 was 28.6 A with a helium level of 40 inches. These fitted resistances were respectively $8.7785 \times 10^{-12}\Omega$, $9.4752 \times 10^{-12}\Omega$, and $1.4757 \times 10^{-11}\Omega$. The data was replotted in FIG. 32B with fitted ΔB/B 3202 values for run 1 3210, run 2 3212, and run 3 3214.

Figure 33A:
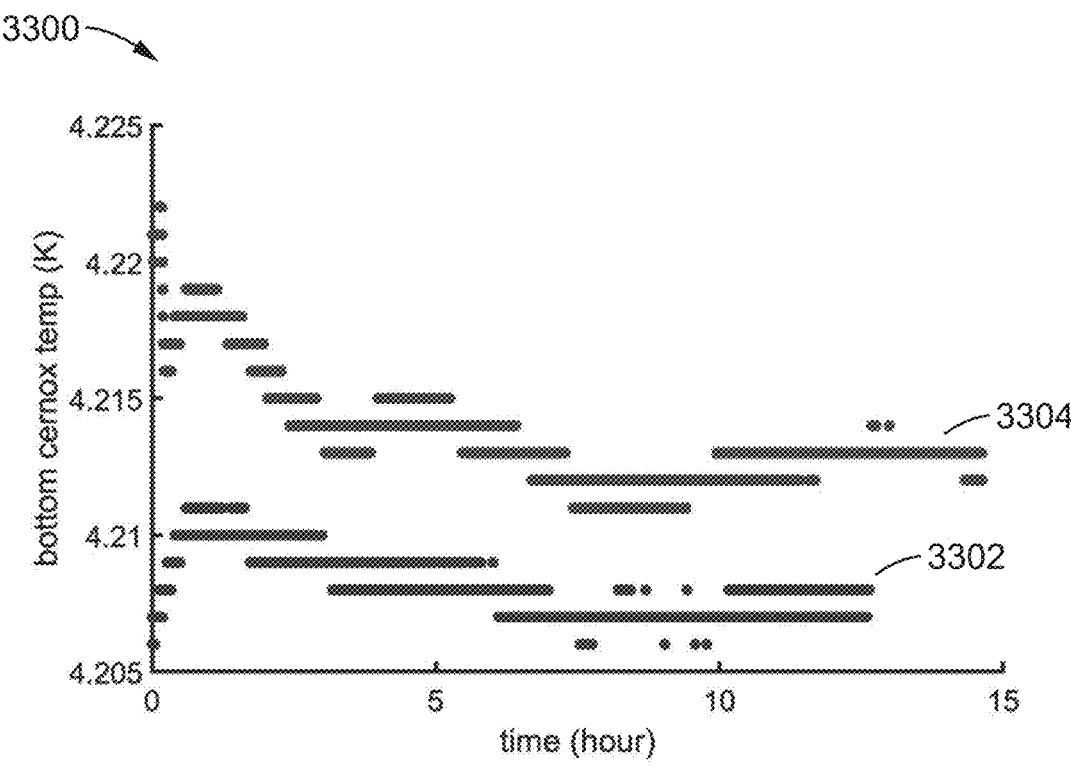
FIG. 33A is a graph of $\Delta B$ in Gauss versus time of a thin film cernox sensor in a calm cryostat in an experimental run with 24.3 A and a helium level of 30 inches.
Figure 33B:
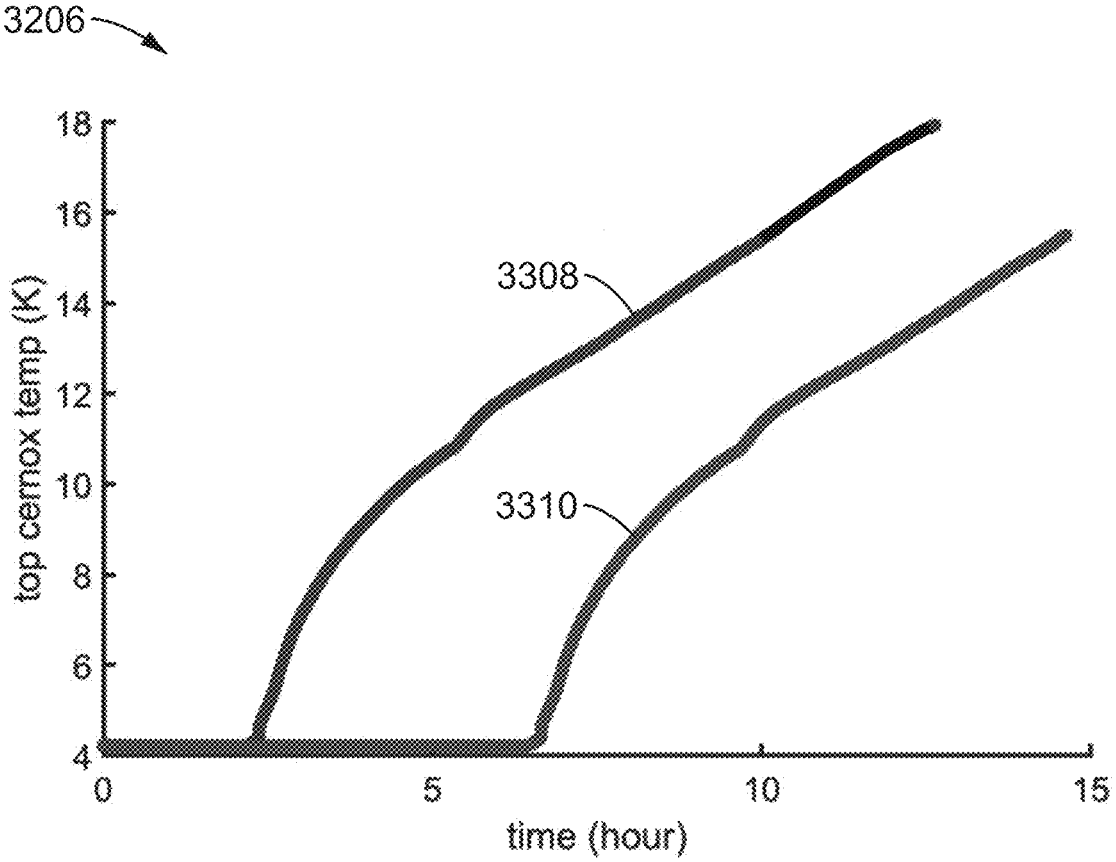
FIG. 33B is a graph of measured voltage versus time of FIG. 33A.

Refer now to FIG. 33A and FIG. 33B. These figures show temperatures measured with a thin film cernox temperature sensor. FIG. 33A shows 3300 bottom temperatures 3302 with the run 2 helium level of 30 inches and 24.3 A, and with the run 3 helium level of 40 inches 3304 and 28.6 A. FIG. 33B shows 3306 bottom temperatures 3308 with the run 2 helium level of 30 inches and 24.3 A, and with the run 3 helium level of 40 inches 3310 and 28.6 A.

Taking FIG. 32A, FIG. 32B, FIG. 33A, and FIG. 33B, it becomes apparent that long term measurements to determine the decay rate and superconductive junction resistances are complicated by both settling time and drift.

Figure 34A:
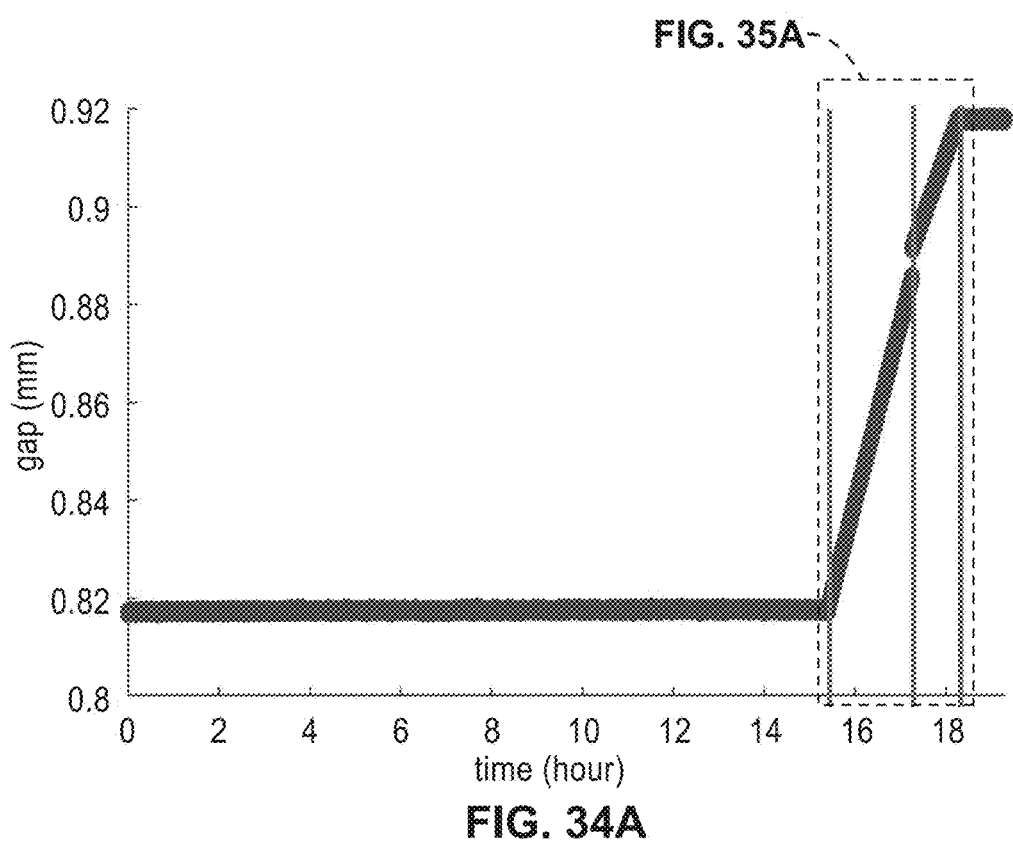
FIG. 34A is a graph of gap versus time over a period of about 19 hours.
Figure 34B:
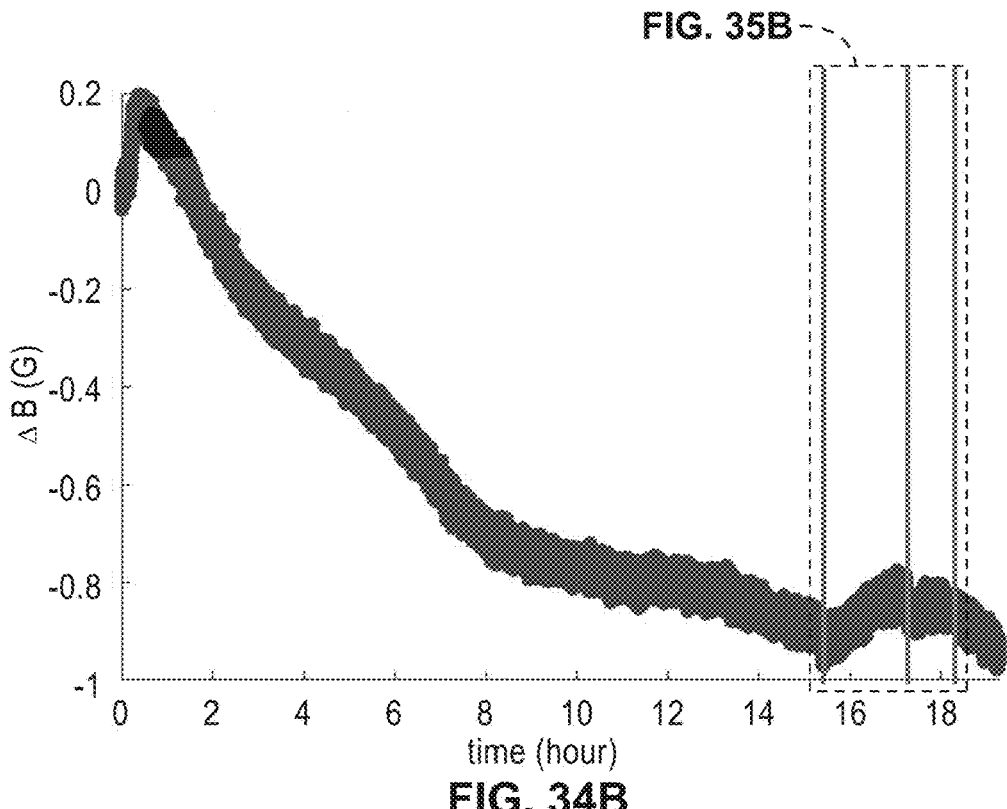
FIG. 34B is a graph of $\Delta B$ in Gauss versus time of FIG. 34A.
Figure 35A:
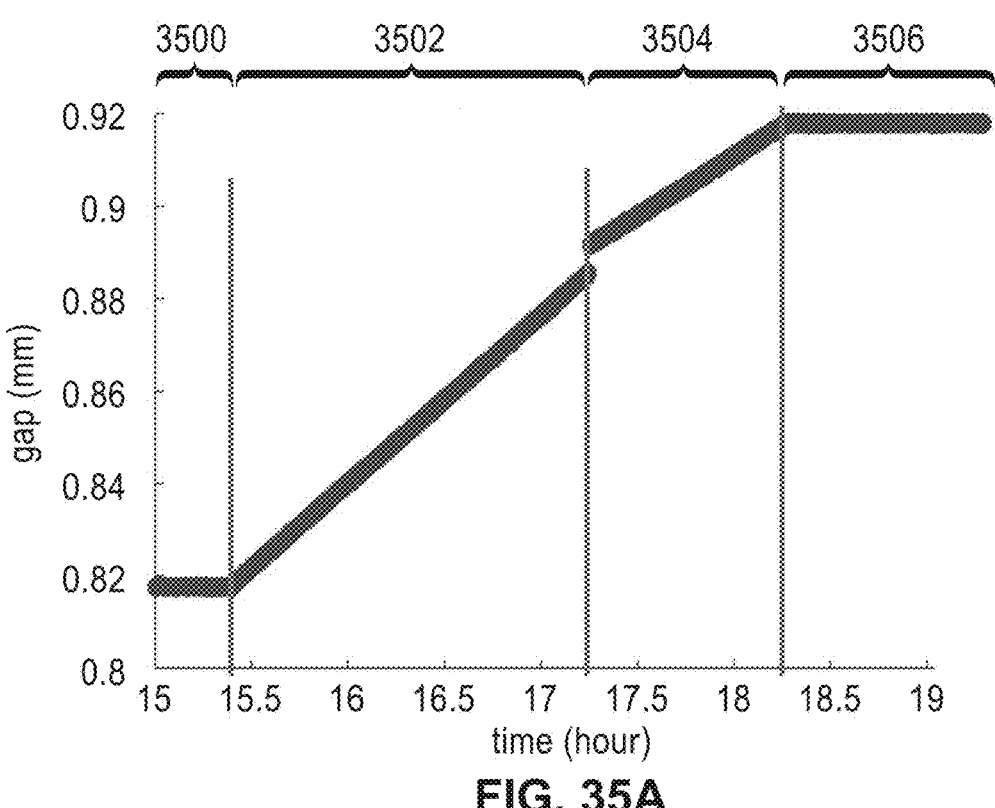
FIG. 35A is an enlarged segment of the graph of FIG. 34A.
Figure 35B:
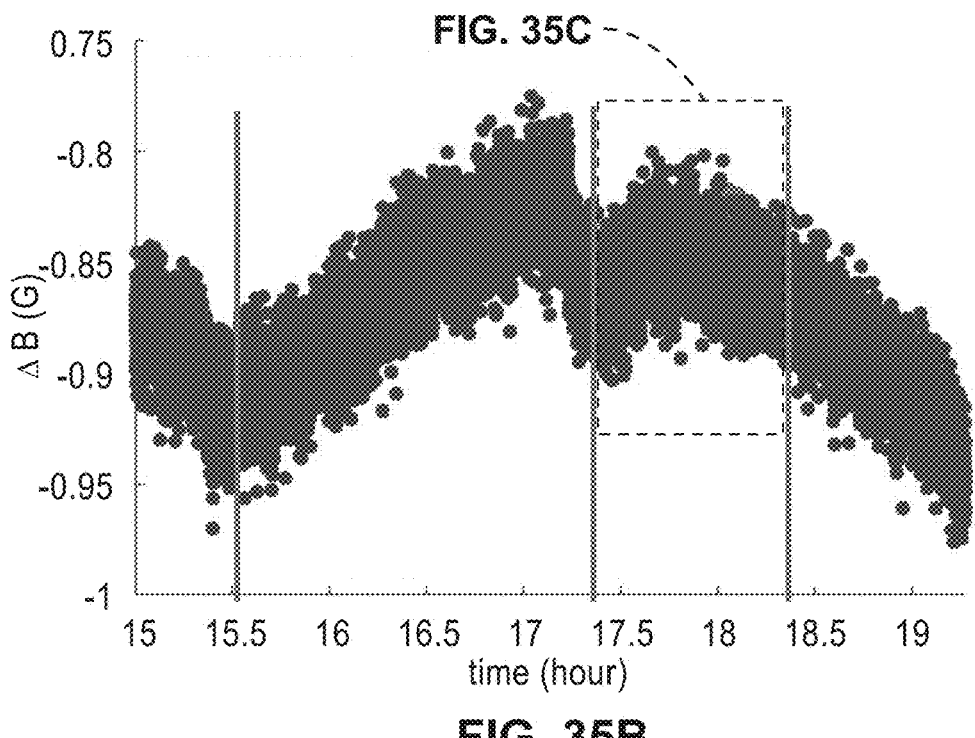
FIG. 35B is a graph of $\Delta B$ in Gauss for the corresponding times of FIG. 35A.

Refer now to FIG. 34A, FIG. 34B, FIG. 35A, and FIG. 35B. FIG. 34A is a graph of gap versus time over a period of about 19 hours. FIG. 34B shows the field strength decay over the same time period as FIG. 34A. FIG. 35A is an enlarged view of the time period of 15-19 hours of FIG. 34A. Similarly, FIG. 35B is an enlarged view of the time period of 15-19 hours of FIG. 34B.

Figure 35C:
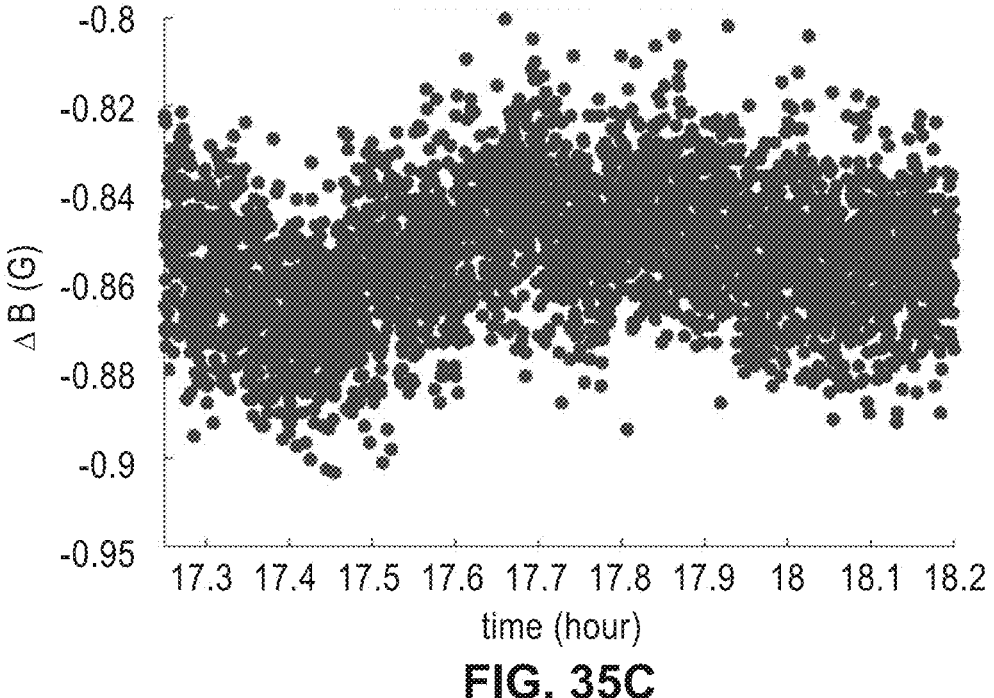
FIG. 35C is an enlarged view of the data from about 17.3-18.3 hours (corresponding to the period shown in FIG. 35A), showing a stabilized fairly constant field strength of about −0.085 G.

Referring now to just FIG. 35A, FIG. 35B, and FIG. 35C, the initial decay region is shown 3500. In the next time period 3502, the initial rate was too fast, followed by a much better rate 3504, finally resuming decay 3506 when stabilization ends. FIG. 35B shows the magnetic field strength measurements for the corresponding times of FIG. 35A. The time period of about 17.3-18.3 hours (corresponding to the period 3504 of FIG. 35A) shows a fairly constant field strength, indicating that active stabilization is possible. FIG. 35C is an enlarged view of the data from about 17.3-18.3 hours (corresponding to the period 3504 of FIG. 35A), showing a stabilized fairly constant field strength of about –0.085 G.

In summary, it appears that movable yoke flux stabilization with capacitive position measurement is achievable, and works fairly well in liquid He. These initial tests showed that initial persistent current tuning was possible at close to the Hall probe noise and drift limit. This appears to be a good proof-of-principle. There was some difficulty with superconductive joint resistance measurements, but these appear to be due to cryostat transients. However, this first attempt at decay stabilization appeared successful.

Active Stabilization of Persistent Current Systems

A next step would be to demonstrate active stabilization. For magnetic resonance imaging (MRI), one of the most prolific applications of superconducting magnets, there are strict requirements on field drift typically of the order of 0.01-0.1 ppm per hour. This criterium is significantly more challenging for emerging high-field MRI/NMR and other specialty magnets for which the use of high-temperature superconductors (HTS) leads to increased losses in the superconducting circuit. It is much more challenging to make low resistance joints with HTS material compared to Nb—Ti. When simple joint techniques are used, the joint resistances for HTS materials can be ~100-1000× higher than NbTi.

In addition, the lower index value "n" in the power law behavior of the HTS materials can lead to increased loss within the bulk conductor itself in regions of the magnet where the superconductor is near the physical limits (typically the high-field region). This may require keeping the magnet operating point farther from the conductor limit, which results in the use of additional lengths of HTS conductor, which is costly. For these reasons, there is a strong motivation for developing stabilization techniques for HTS magnets. The inductance-based flux tuning and stabilization technique presented in this Application is fully compatible with HTS materials and operation points up to liquid nitrogen temperatures (77 K) and higher. In such a scenario, an HTS material could be used in both the main magnet and the tuning device. This would form a closed superconducting loop within which both the inductance and current are linked, meaning the same principles discussed for low-temperature-superconducting magnet stabilization would also apply.

Figure 36A:
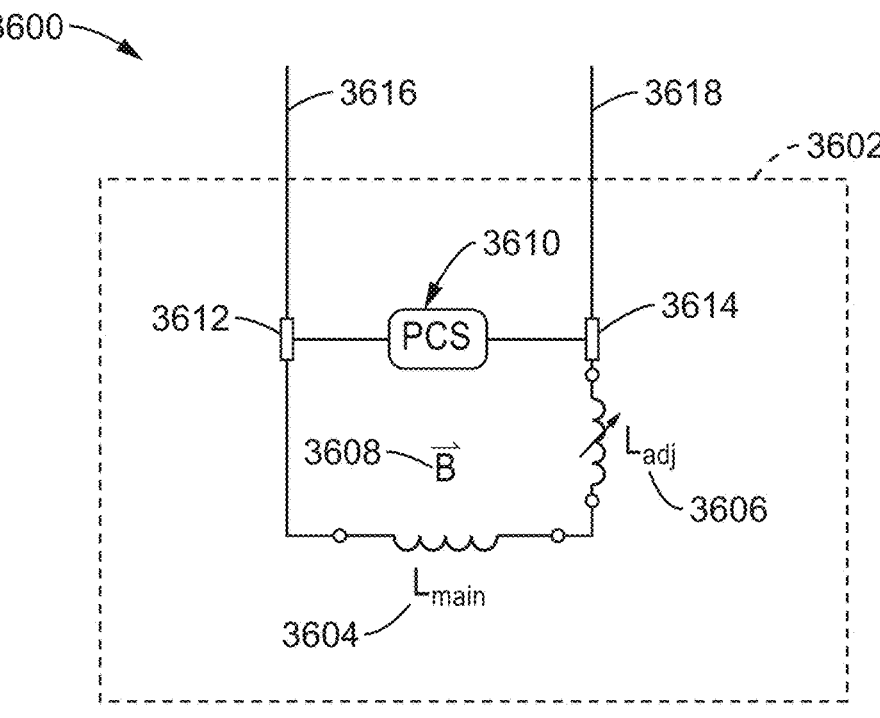
FIG. 36A is a high-level schematic of an actively stabilized superconducting persistent current system in a cryostat.
Figure 36B:
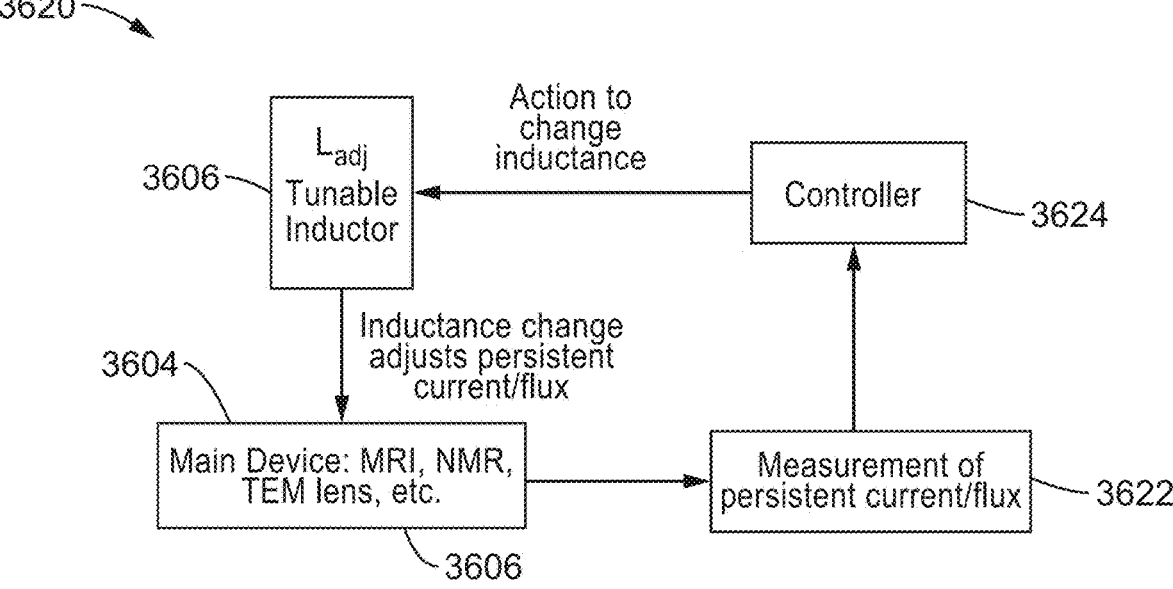
FIG. 36B shows the feedback control system of FIG. 36A in a simplified manner.

Refer now to FIGS. 36A and 36B. FIG. 36A is a high-level schematic 3600 of an actively stabilized superconducting system in a cryostat 3602 comprising a main inductor $L_{main}$ 3604 in series with an adjustable inductor $L_{adj}$ 3606 use to actively control and stabilize the magnetic field 3608 of the persistent current system 3610 despite losses that would cause the magnetic field 3608 to decay, primarily due to less than perfectly superconducting joints 3612, 3614.

The persistent current system 3610 is initially driven externally from the cryostat 3602 via electrically conductive leads 3616, 3618.

In FIG. 36B, the feedback control system 3620 is shown in a simplified manner. Here, the main device, whether it be a magnetic resonance imager (MRI), nuclear magnetic resonance (NMR) device, transmission electron microscope (TEM) lens, etc. is modeled by main inductor $L_{main}$ 3604. The state of the magnetic field 3608 in the system is measured 3622, either by direct current measurement, or the flux of the magnetic field 3608 through a Hall effect, or a cryogenic Hall effect sensor. A controller 3624 uses the measurements of the magnetic field 3608, and takes action to stabilize the magnetic field 3608 through a change in the inductance of the adjustable inductor $L_{adj}$ 3606. This inductance change adjusts the persistent current, and thereby the magnetic field 3608 flux in a feedback manner.

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general-purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure(s) algorithm(s), step(s), operation(s), formula (e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device configured for executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present application encompasses multiple implementations of the technology which include, but are not limited to, the following:

An apparatus for storage of magnetic flux at cryogenic temperatures comprising: (a) a variable inductor; (b) wherein the variable inductor is capable of storing a magnetic flux in situ within a cryogenic system capable of a persistent magnetic operation mode.

An apparatus for storage of magnetic flux at cryogenic temperatures comprising a variable inductor configured for storing a magnetic flux in situ within a cryogenic system capable of a persistent magnetic operation mode.

An apparatus for storage of magnetic flux at cryogenic temperatures comprising a variable inductor configured for storing a magnetic flux in situ within a cryogenic system configured for a persistent magnetic operation mode.

The apparatus of any preceding or following implementation, wherein the variable inductor is configured for inductance change by a change of geometry.

The apparatus of any preceding or following implementation, wherein the inductance change is by a movement of a superconducting material.

The apparatus of any preceding or following implementation, wherein the inductance change is by a change in geometry of the variable inductor.

The apparatus of any preceding or following implementation, wherein the change in geometry is a movement of a movable yoke relative to a C-shaped yoke section, thereby changing an area enclosed by the C-shaped yoke section and the movable yoke.

The apparatus of any preceding or following implementation, wherein the variable inductor is configured for inductance change by a change in permeability.

The apparatus of any preceding or following implementation, wherein the change in permeability is due to magnetostriction.

The apparatus of any preceding or following implementation, wherein the magnetostriction is due to a force applied by a piezoelectric source.

The apparatus of any preceding or following implementation, wherein the magnetostriction is due to a force applied by a lead screw.

The apparatus of any preceding or following implementation, further comprising: (a) a superconducting magnetic circuit; (b) the variable inductor in series with the superconducting magnetic circuit; (c) wherein the superconducting magnetic circuit and the variable inductor are situated within a cryostat; and (d) wherein the variable inductor is superconducting.

The apparatus of any preceding or following implementation, wherein the variable inductor is used in a feedback circuit to maintain a substantially constant current within the superconducting magnetic circuit.

The apparatus of any preceding or following implementation, wherein the substantially constant current gives rise to a persistent magnetic field within the superconducting magnetic circuit.

The apparatus of any preceding or following implementation, wherein the persistent magnetic field is measured by a magnetic field measurement device selected from one of: a Hall effect sensor, a superconducting quantum interference device (SQUID), and a graphene Hall sensor.

The apparatus of any preceding or following implementation, wherein the variable inductor is used in a feedback circuit to maintain a substantially constant persistent magnetic field within the superconducting persistent magnetic circuit.

The apparatus of any preceding or following implementation, wherein the persistent magnetic field is measured by a magnetic field measurement device selected from one of: a Hall effect sensor, a superconducting quantum interference device (SQUID), a graphene Hall sensor, and an NMR-based magnetic field measurement probe.

The apparatus of any preceding or following implementation, wherein the persistent magnetic field is measured at a constant spatial location or spatial region.

A method for maintaining a persistent magnetic field in a cryogenic apparatus, comprising: (a) providing a variable inductor in series with a main inductor to create a superconducting circuit; (b) inducing a persistent magnetic field within the main inductor; (c) measuring a field strength of the persistent magnetic field; (d) controlling the persistent magnetic field strength by changing an inductance of the variable inductor; (e) whereby the persistent magnetic field is maintained at a controlled level.

The method of any preceding or following implementation, wherein the variable inductor is configured for storing a magnetic flux in situ within the superconducting circuit.

The method of any preceding or following implementation, wherein the variable inductor is configured for inductance change by a change of geometry.

The method of any preceding or following implementation, wherein the variable inductor is configured for inductance change by a movement of a superconducting material.

The method of any preceding or following implementation, wherein the inductance change is by a change in geometry of the variable inductor.

The method of any preceding or following implementation, wherein the change in geometry is a movement of a movable yoke relative to a C-shaped yoke section, thereby changing an area enclosed by the C-shaped yoke section and the movable yoke.

The method of any preceding or following implementation, wherein the variable inductor is configured for inductance change by a change in permeability.

The method of any preceding or following implementation, wherein the change in permeability is due to magnetostriction.

The method of any preceding or following implementation, wherein the magnetostriction is due to a force applied by a piezoelectric source.

The method of any preceding or following implementation, wherein the magnetostriction is due to a force applied by a lead screw.

The method of any preceding or following implementation: (a) wherein the superconducting circuit and the variable inductor are situated within a cryostat; and (b) wherein the variable inductor is superconducting.

The method of any preceding or following implementation, wherein the variable inductor is used in a feedback circuit to maintain a substantially constant current within the superconducting circuit.

The method of any preceding or following implementation, wherein the substantially constant current gives rise to a persistent magnetic field within the superconducting circuit.

The method of any preceding or following implementation, wherein the persistent magnetic field is measured by a magnetic field measurement device selected from one of: a Hall effect sensor, a superconducting quantum interference device (SQUID), and a graphene Hall sensor.

The method of any preceding or following implementation, wherein the variable inductor is used in a feedback circuit to maintain a substantially constant persistent magnetic field within the superconducting circuit.

The method of any preceding or following implementation, wherein the persistent magnetic field is measured by a magnetic field measurement device selected from one of: a Hall effect sensor, a superconducting quantum interference device (SQUID), and a graphene Hall sensor.

The method of any preceding or following implementation, wherein the persistent magnetic field is measured at a constant spatial location or spatial region.

As used herein, term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present application describe where either A, B, or C can be present, or any combination of items A, B and C. Phrasing constructs indicating, such as "at least one of" followed by listing a group of elements, indicates that at least one of these group elements is present, which includes any possible combination of the listed elements as applicable.

References in this application referring to "an embodiment", "at least one embodiment" or similar embodiment wording indicates that a particular feature, structure, or characteristic described in connection with a described embodiment is included in at least one embodiment of the present application. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system or method.

As used herein, the term "set" refers to a collection of one or more objects. Thus, for example, a set of objects can include a single object or multiple objects.

Relational terms such as first and second, top and bottom, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to $\pm10\%$ of that numerical value, such as less than or equal to $\pm5\%$, less than or equal to $\pm4\%$, less than or equal to $\pm3\%$, less than or equal to $\pm2\%$, less than or equal to $\pm1\%$, less than or equal to $\pm0.5\%$, less than or equal to $\pm0.1\%$, or less than or equal to $\pm0.05\%$. For example, "substantially" aligned can refer to a range of angular variation of less than or equal to $\pm10°$, such as less than or equal to $\pm5°$, less than or equal to $\pm4°$, less than or equal to $\pm3°$, less than or equal to $\pm2°$, less than or equal to $\pm1°$, less than or equal to $\pm0.5°$, less than or equal to $\pm0.1°$, or less than or equal to $\pm0.05°$.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential features or elements of the technology describes herein or any or all the claims.

In addition, in the foregoing application various features may grouped together in various embodiments for the purpose of streamlining the application. This method of application is not to be interpreted as reflecting an intention that the claimed embodiments require more features than are expressly recited in each claim. Inventive subject matter can lie in less than all features of a single disclosed embodiment.

The abstract of the application is provided to allow the reader to quickly ascertain the nature of the technical application. It is submitted with the understanding that it will not be used to interpret or limit the scope or meaning of the claims.

It will be appreciated that the practice of some jurisdictions may require deletion of one or more portions of the application after that application is filed. Accordingly, the reader should consult the application as filed for the original content of the application. Any deletion of content of the application should not be construed as a disclaimer, forfeiture or dedication to the public of any subject matter of the application as originally filed.

The following claims are hereby incorporated into the application, with each claim standing on its own as a separately claimed subject matter.

Although the description herein contains many details, these should not be construed as limiting the scope of the application but as merely providing illustrations of some of the presently preferred embodiments. Therefore, it will be appreciated that the scope of the application fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present application is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Stabilization Criteria for a TEM lens and a 1.5-3.0 T MRI magnet TEM Lens MRI

|  | TEM Lens | MRI |
|---|---|---|
| $\dfrac{\Delta I_{tol}}{I_0}$ | $10^{-9}$ | $10^{-3}$ |
| $\Delta t_{stab}$ | 1 day | 1 year |

TABLE 2

Linear Cryogenic Actuator Properties (at 4° K)

|  | Value | Units |
|---|---|---|
| Range | 6 | mm |
| Minimum Step | 1 | nm |
| Encoder Resolution | 0.35 | µm |
| Maximum Force | 20 | N |

TABLE 3

| Variables | | | |
|---|---|---|---|
| Design Choice | | Fixed | |
| Variable | Symbol | Variable | Symbol |
| Initial Gap | g | Nominal Current | $I_0$ |
| Pole Area | A | Main Coil Inductance | $L_m$ |
| Turns | N | Max Current Deviation | $\frac{\Delta I_{tol}}{I_0}$ |
| | | Stabilization Time | $\Delta t_{stab}$ |
| | | Circuit Resistance | R |

TABLE 4

| Assumptions for TEM Lens | | | |
|---|---|---|---|
| variable | symbol | source | value |
| nominal current | $I_0$ | design | 25 A |
| main coil inductance | $L_m$ | design | 10 mH |
| circuit resistance | R | typical NbTi-NbTi joints | $10^{-12} - 10^{-14}$ Ω |
| max current deviation | $\frac{\Delta I_{tol}}{I_0}$ | lens focus drift | $10^{-9}$ |
| stabilizing time | $\Delta t_{stab}$ | TEM operation | 1 day |
| force | F | linear actuator | <20 N |
| maximum travel | $\Delta g_{max}$ | linear actuator | <6 mm |
| gap step size | $\Delta g$ | linear actuator and positional tol. | >.1-1 μm |
| field | B | yoke saturation | <1.5 T |

TABLE 5

| Stabilization Properties vs. Circuit Resistance | | | |
|---|---|---|---|
| circuit resistance | Δt between adjustments: Eqn. 25 | adjustments per day | max Δ g |
| $10^{-12}$ Ω | 10 sec | 8640 | 0.69 μm |
| $10^{-13}$ Ω | 100 sec | 864 | 6.94 μm |
| $10^{-14}$ Ω | 1000 sec | 86 | 69.44 μm |

TABLE 6

| Design for a TEM tuner | | |
|---|---|---|
| variable | symbol | value |
| turns | N | 4 |
| pole area | A | 35.81 mm$^2$ |
| initial gap | g | 3 mm |
| gap step size $\left(\text{for } \frac{\Delta I_{tol}}{I_0} = 10^{-9}\right)$ | $\Delta g$ | 0.25 μm |
| force | N | 12.5 mN |
| field | B | 0.021 T |
| inductance | $L_b$ | 0.12 μH |

TABLE 7

| FEM Results for a TEM tuner | | | |
|---|---|---|---|
| variable | symbol | μ = ∞ | 1006 steel |
| turns | N | 4 | 4 |
| pole area | A | 35.81 mm$^2$ | 35.81 mm$^2$ |
| initial gap | g | 3 mm | 3 mm |
| gap step $\left(\text{for } \frac{\Delta I_{tol}}{I_0} = 10^{-9}\right)$ | $\Delta g$ | 0.25 μm | 0.08 μm |
| force | N | 12.5 mN | 9.05 mN |
| field | B | 0.021 T | 0.019 T |
| inductance | $L_b$ | 0.12 μH | 0.37 μH |

TABLE 8

| Assumptions for 1.5 T MRI | | | |
|---|---|---|---|
| variable | symbol | source | value |
| nominal current | $I_0$ | design | 500 A |
| main coil inductance | $L_m$ | design | 25 H |
| circuit resistance | R | typical NbTi-NbTi joints | $10^{-12}$-$10^{-14}$ Ω |
| adjustment interval | Δt | assumption | 1 week |
| total stabilizing time | $\Delta t_{stab}$ | assumption | 1 year |
| force | F | linear actuator | <200 N |
| maximum travel | $\Delta g_{max}$ | linear actuator | <50 mm |

TABLE 9

| Design for an MRI tuner | | |
|---|---|---|
| Variable | symbol | value |
| Turns | N | 8 |
| Pole Area | A | 1842 mm$^2$ |
| Initial Gap | g | 7 mm |
| Gap Step Size $\left(\text{for } \frac{\Delta I_{tol}}{I_0} = 2.4 \times 10^{-8}\right)$ | $\Delta g$ | 0.4 mm |
| Force | N | 189 N |
| Field | B | 0.4 T |
| Inductance | $L_b$ | 10.58 μH |

TABLE 10

| FEM Results for an MRI Flux Tuner | | | |
|---|---|---|---|
| Variable | symbol | μ = ∞ | 1006 steel |
| Turns | N | 4 | 4 |
| Pole Area | A | 1842 mm$^2$ | 1842 mm$^2$ |
| Initial Gap | g | 7 mm | 7 mm |
| Gap Step $\left(\text{for } \frac{\Delta I_{tol}}{I_0} = 2.4 \times 10^{-8}\right)$ | $\Delta g$ | 0.4 mm | 0.218 mm |
| Force | N | 189 N | 101 N |
| Field | B | 0.36 T | .35 T T |
| Inductance | $L_b$ | 10.58 μH | 19.36 μH |

TABLE 11

| Parameters for FEM Tuning Model | |
|---|---|
| Pole Width | 2.12 mm |
| Length | 1.0 m |
| $I_0$ | 25 A |

TABLE 11-continued

| Parameters for FEM Tuning Model | |
| --- | --- |
| N | 2 turns |
| Initial Gap | 1.5 mm |
| $\dfrac{\Delta l}{l_0}$ | $10^{-5}$ |
| $L_m$ | 10 mH |
| R | $1.61 \times 10^{-9}$ $\Omega$ |

What is claimed is:

1. An apparatus for storage of magnetic flux at cryogenic temperatures comprising:

(a) a variable inductor;

(b) wherein the variable inductor is configured for storing a magnetic flux in situ within a cryogenic system configured for a persistent magnetic operation mode;

(c) wherein said variable inductor operates as a flux bank which is charged at the initial point of powering the circuit; and (d) wherein said variable inductor performs flux pumping to a closed superconducting magnetic circuit through inductive transfer, without the need of breaking and closing superconducting connections to move flux into the closed superconducting magnetic circuit.

2. The apparatus of claim 1, wherein the variable inductor is configured for inductance change by a change of geometry.

3. The apparatus of claim 2, wherein the inductance change is by a movement of a superconducting material.

4. The apparatus of claim 2, wherein the inductance change is by a change in geometry of the variable inductor.

5. The apparatus of claim 4, wherein the change in geometry is a movement of a movable yoke relative to a C-shaped yoke section, thereby changing an area enclosed by the C-shaped yoke section and the movable yoke.

6. The apparatus of claim 1, wherein the variable inductor is configured for inductance change by a change in permeability.

7. The apparatus of claim 6, wherein the change in permeability is due to magnetostriction.

8. The apparatus of claim 7, wherein the magnetostriction is due to a force applied by a piezoelectric source.

9. The apparatus of claim 7, wherein the magnetostriction is due to a force applied by a lead screw.

10. The apparatus of claim 1, comprising:

(a) the variable inductor in series with the superconducting magnetic circuit;

(b) wherein the superconducting magnetic circuit and the variable inductor are situated within a cryostat; and (c) wherein the variable inductor is superconducting.

11. The apparatus of claim 10, wherein the variable inductor is used in a feedback circuit to maintain a substantially constant current within the superconducting magnetic circuit.

12. The apparatus of claim 11, wherein the substantially constant current gives rise to a persistent magnetic field within the superconducting magnetic circuit.

13. The apparatus of claim 12, wherein the persistent magnetic field is measured by a magnetic field measurement device selected from one of: a Hall effect sensor, a superconducting quantum interference device (SQUID), and a graphene Hall sensor, and an NMR-based magnetic field measurement probe.

14. The apparatus of claim 10, wherein the variable inductor is used in a feedback circuit to maintain a substantially constant persistent magnetic field within the superconducting persistent magnetic circuit.

15. The apparatus of claim 14, wherein the persistent magnetic field is measured by a magnetic field measurement device selected from one of: a Hall effect sensor, a superconducting quantum interference device (SQUID), a graphene Hall sensor, and an NMR-based magnetic field measurement probe.

16. The apparatus of claim 15, wherein the persistent magnetic field is measured at a constant spatial location or spatial region.

17. A method for maintaining a persistent magnetic field in a cryogenic apparatus, comprising:

(a) providing a variable inductor in series with a main inductor to create a superconducting circuit;

(b) inducing a persistent magnetic field within the main inductor;

(c) measuring a field strength of the persistent magnetic field;

(d) controlling the persistent magnetic field strength by changing an inductance of the variable inductor which operates as a flux bank which performs flux pumping through inductive transfer;

(e) whereby the persistent magnetic field is maintained at a controlled level in response to shifting flux to and from the variable inductor and main inductor.

18. The method of claim 17, wherein said inductance change of the variable inductor results from a change of geometry of the variable inductor, or from a change by a movement of a superconducting material, or from a change in permeability of the variable inductor, or from a change in permeability of the variable inductor due to magnetostriction, or from a change in permeability of the variable inductor due to magnetostriction due to a force applied by a piezoelectric source, or from a change in permeability of the variable inductor due to magnetostriction due to a force applied by a lead screw, or from a change in geometry of the variable inductor due to movement of a movable yoke relative to a C-shaped yoke section thereby changing an area enclosed by the C-shaped yoke section and the movable yoke.

19. The method of claim 17, wherein the persistent magnetic field is measured by a magnetic field measurement device selected from one of: a Hall effect sensor, a superconducting quantum interference device (SQUID), a graphene Hall sensor, and an NMR-based magnetic field measurement probe.

20. The method of claim 19, wherein the persistent magnetic field is measured at a constant spatial location or spatial region.

* * * * *